United States Patent
Park et al.

(10) Patent No.: US 10,656,743 B2
(45) Date of Patent: May 19, 2020

(54) DISPLAY APPARATUS

(71) Applicant: LG DISPLAY CO., LTD., Seoul (KR)

(72) Inventors: YongSeok Park, Paju-si (KR);
JungHyun Lee, Paju-si (KR);
Yeonkyung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/197,314

(22) Filed: Nov. 20, 2018

(65) Prior Publication Data
US 2019/0155433 A1   May 23, 2019

(30) Foreign Application Priority Data
Nov. 22, 2017 (KR) .................. 10-2017-0156487

(51) Int. Cl.
*G06F 3/041* (2006.01)
*G06F 3/044* (2006.01)
*G09G 3/36* (2006.01)
*G02F 1/1362* (2006.01)
*H01L 27/12* (2006.01)

(52) U.S. Cl.
CPC ...... *G06F 3/0412* (2013.01); *G02F 1/136286* (2013.01); *G06F 3/044* (2013.01); *G06F 3/0416* (2013.01); *G06F 3/0443* (2019.05); *G06F 3/04184* (2019.05); *G09G 3/3648* (2013.01); *G09G 3/3677* (2013.01); *H01L 27/1214* (2013.01); *H01L 27/1255* (2013.01); *G02F 2201/121* (2013.01); *G02F 2201/123* (2013.01); *G09G 3/3666* (2013.01); *G09G 2310/0286* (2013.01); *G09G 2320/0223* (2013.01); *G09G 2330/021* (2013.01)

(58) Field of Classification Search
CPC ...... G06F 3/0416; G06F 3/0412; G06F 3/044; G06F 3/0443; G06F 3/04184; G09G 3/3648; G09G 2330/021; G02F 1/136286; G02F 2201/123; G02F 2201/121; H01L 27/1214
See application file for complete search history.

(56) References Cited

U.S. PATENT DOCUMENTS

| | | | | |
|---|---|---|---|---|
| 2009/0102779 A1* | 4/2009 | Jo | ........ | G09G 3/3696 345/101 |
| 2010/0051952 A1* | 3/2010 | Kim | ........ | H01L 27/1288 257/59 |
| 2010/0085282 A1* | 4/2010 | Yu | ........ | G09G 3/3233 345/76 |
| 2012/0146978 A1* | 6/2012 | Park | ........ | G11C 19/287 345/211 |
| 2016/0224175 A1* | 8/2016 | Moon | ........ | G06F 3/0412 |

* cited by examiner

*Primary Examiner* — Muhammad N Edun
(74) *Attorney, Agent, or Firm* — Polsinelli PC

(57) ABSTRACT

A display apparatus includes a display panel including a display area including a plurality of gate lines, a plurality of data lines, and a plurality of touch sensors, a gate driving circuit dividing the display area into a plurality of horizontal blocks and driving gate lines of a horizontal block by units of horizontal blocks at every display period in one frame, and a touch driving circuit sensing a touch through touch sensors of the horizontal block by units of horizontal blocks at every touch sensing period in the one frame.

19 Claims, 12 Drawing Sheets

DISPLAY APPARATUS

CROSS-REFERENCE TO RELATED APPLICATION

This application claims the benefit of the Korean Patent Application No. 10-2017-0156487 filed on Nov. 22, 2017, which is hereby incorporated by reference in its entirety as if fully set forth herein.

BACKGROUND

Field of the Disclosure

The present disclosure relates to a display apparatus including a touch sensor.

Description of the Background

With the advancement of information-oriented society, various requirements for display apparatuses for displaying an image are increasing, and various types of display apparatuses such as liquid crystal display (LCD) apparatuses and organic light emitting display (OLED) apparatuses are being practically used. In electronic devices including a display apparatus, mobile devices such as mobile phones, smartphones, smart watches, tablet personal computers (PCs), or watch phones and medium and large-sized devices such as smart televisions (TVs), notebook computers, or monitors provide a touch screen type user interface, for convenience of a user input. Display apparatuses capable of touch processing are being developed for providing a larger number of various functions, and requirements of users are being diversified.

Display apparatuses including the touch screen type user interface are driven by a time division driving manner which time-divisionally divides a display driving operation of displaying an image on a display panel and a touch driving operation of sensing a touch position and/or a touch force based on a user touch.

A time division driving type user interface may be classified into a vertical blanking manner, which time-divisionally drives one frame in a display period and a touch sensing period to perform a one-time touch report during the one frame, and a horizontal blanking manner which time-divisionally drives one frame in a plurality of display periods and a plurality of touch sensing periods to perform a touch report a plurality of times during the one frame. Thus, the horizontal blanking manner has a touch report rate of 120 Hz or higher, and thus, enhances touch sensitivity in comparison to the vertical blanking manner.

A display apparatus based on the horizontal blanking manner includes a gate driving circuit including a shift register for time division driving. The shift register is embedded (or integrated) into a display panel and includes a plurality of driving stage blocks for display driving and a plurality of holding stage blocks for touch driving.

Each of the driving stage blocks and the holding stage blocks is configured with a stage circuit including a plurality of oxide thin film transistors (TFTs) having mobility which is higher than that of amorphous TFTs, for realizing a thin bezel width of a display apparatus. In comparison with the amorphous TFTs, the oxide TFTs have a problem where deterioration is not recovered. Particularly, the stage circuit of each of the plurality of holding stage blocks holds an output signal of a front driving stage block during the touch sensing period, and due to this, deterioration of an output TFT is accelerated during the touch sensing period. For this reason, a voltage of a carry signal output through the output TFT is insufficient, causing a reduction in reliability of the carry signal.

The above-described background art is possessed by the inventor of the application for deriving the disclosure, or is technology information that has been acquired in deriving the disclosure. The above-described background is not necessarily known technology disclosed to the general public before the application of the disclosure.

SUMMARY

Accordingly, the present disclosure is directed to provide a display apparatus that substantially obviates one or more problems due to limitations and disadvantages of the related art.

An aspect of the present disclosure is directed to provide a display apparatus including a gate driving circuit, which minimizes deterioration of an output thin film transistor caused by a precharging voltage during a touch sensing period.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a display panel including a display area including a plurality of gate lines, a plurality of data lines, and a plurality of touch sensors, a gate driving circuit dividing the display area into a plurality of horizontal blocks and driving gate lines of a horizontal block by units of horizontal blocks at every display period in one frame, and a touch driving circuit sensing a touch through touch sensors of the horizontal block by units of horizontal blocks at every touch sensing period in the one frame. The gate driving circuit may include a plurality of driving stage groups, each driving stage group including a plurality of driving stages supplying a scan pulse to gate lines included in a corresponding horizontal block at every display period and a plurality of holding stage groups, each holding stage group including at least one holding stage outputting a carry signal to a rear driving stage group, the plurality of holding stage groups being disposed between the plurality of driving stage groups. The at least one holding stage may charge a holding voltage into a holding capacitor in response to an output signal supplied from a front driving stage group and may output the carry signal to the rear driving stage group, based on the holding voltage charged into the holding capacitor.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, In the drawings.

DETAILED DESCRIPTION

Figure 1:
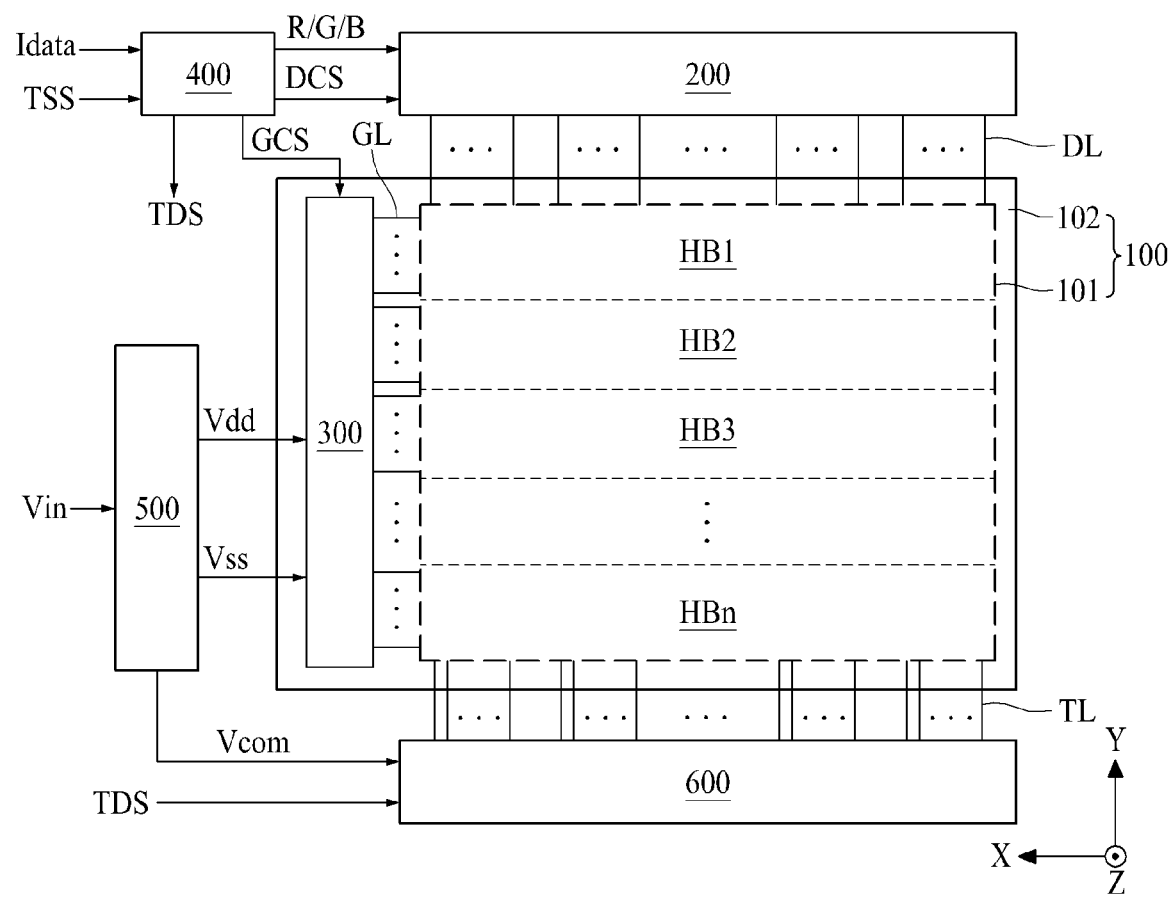
FIG. 1 is a diagram for describing a display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after', 'subsequent', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Hereinafter, aspects of a display apparatus according to the present disclosure will be described in detail with reference to the accompanying drawings. In adding reference numerals to elements of each of the drawings, although the same elements are illustrated in other drawings, like reference numerals may refer to like elements. In the following description, when the detailed description of the relevant known function or configuration is determined to unnecessarily obscure the important point of the present disclosure, the detailed description will be omitted.

Figure 2:
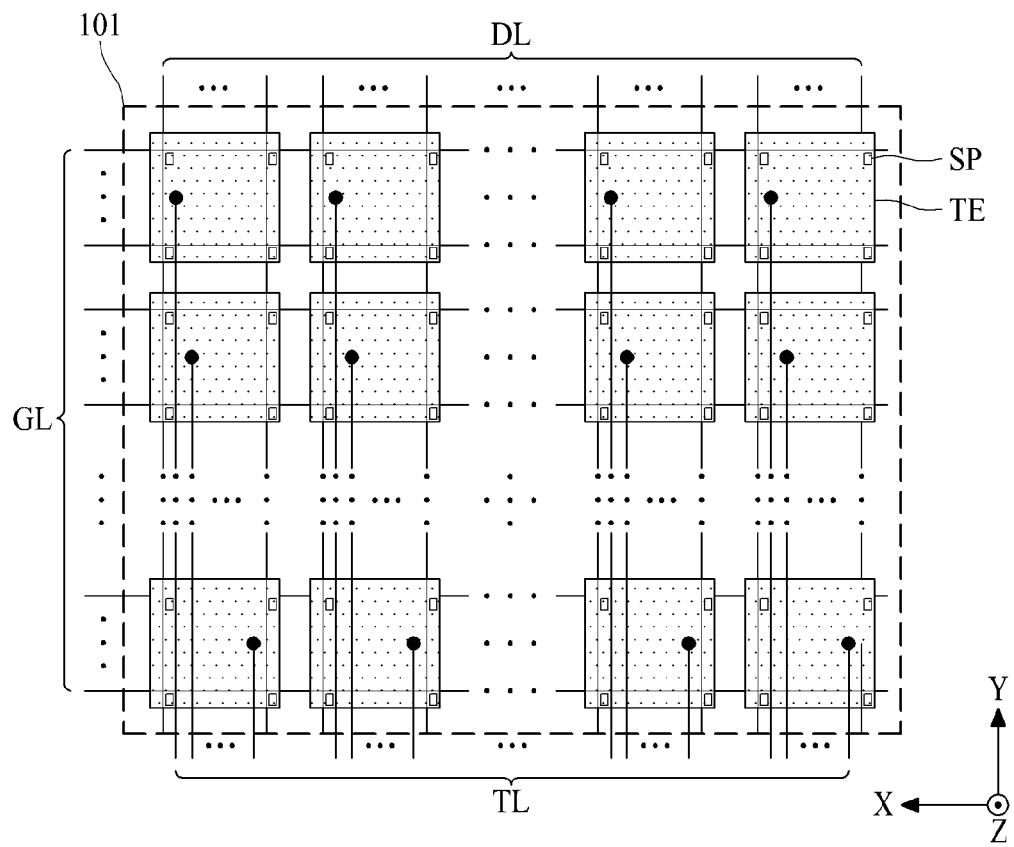
FIG. 2 is a diagram for describing a display area illustrated in FIG. 1.
Figure 3:
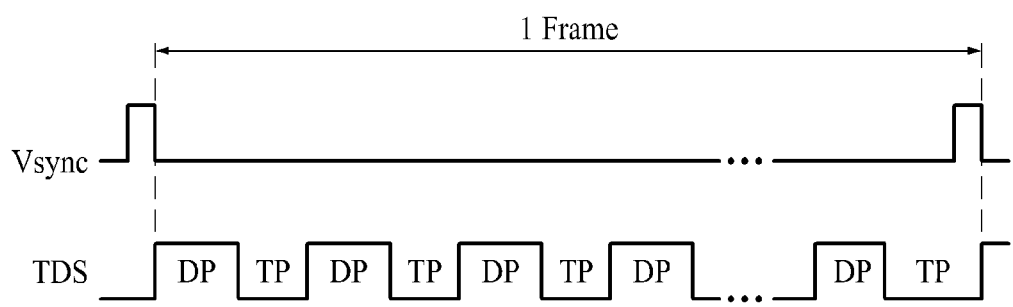
FIG. 3 is a waveform diagram showing a time division driving signal illustrated in FIG. 1.

FIG. 1 is a diagram for describing a display apparatus according to an aspect of the present disclosure. FIG. 2 is a diagram for describing a display area illustrated in FIG. 1. FIG. 3 is a waveform diagram showing a time division driving signal illustrated in FIG. 1.

Referring to FIGS. 1 to 3, the display apparatus according to an aspect of the present disclosure may include a display panel 100, a display driver, and a touch driving circuit 600.

The display panel 100 may be a liquid crystal display panel having an in-cell touch type structure using a capacitive type. For example, the display panel 100 may have an in-cell touch type structure using a self-capacitive type. The display panel 100 may operate in a display mode and a touch sensing mode. For example, the display panel 100 may display an image by using light irradiated from a backlight unit during the display mode and may act as a touch panel for touch sensing during the touch sensing mode. The display mode may be performed in each of a set of display periods in one frame, and the touch sensing mode may be performed in each of a set of touch sensing periods immediately before or after the plurality of display periods in one frame.

The display panel 100 according to an aspect may include a display area 101 provided on a substrate and a non-display area 102 provided in an edge of the substrate to surround the display area 101.

The display area 101 may include a plurality of data lines DL, a plurality of gate lines GL, a plurality of subpixels SP, a plurality of touch electrodes TE, and a plurality of touch routing lines TL.

Each of the plurality of data lines DL may receive a data signal in the display mode. Each of the plurality of gate lines GL may receive a scan pulse in the display mode. The plurality of data lines DL and the plurality of gate lines GL may be arranged on the substrate to intersect one another, thereby defining a plurality of subpixel areas.

Each of the plurality of subpixels SP may include a thin film transistor (TFT) connected to a gate line GL and a data line DL adjacent thereto, a pixel electrode connected to the TFT, and a storage capacitor connected to the pixel electrode.

The TFT may include a gate terminal, a semiconductor layer, a first terminal, and a second terminal. The first terminal and the second terminal of the TFT may each be defined as a source terminal or a drain terminal, based on a direction of a current. The TFT may have a bottom gate structure where the gate terminal is disposed under the semiconductor layer and/or a top gate structure where the gate terminal is disposed on the semiconductor layer. The TFT may be covered by a passivation layer (or a planarization layer).

The pixel electrode may be formed of a transparent conductive material on the passivation layer in a subpixel area and may be connected to the second terminal of the TFT through a via hole provided in the passivation layer.

The storage capacitor may be provided between the second terminal of the TFT and a corresponding touch electrode TE, or may be provided between the pixel electrode and the touch electrode TE. The storage capacitor may be charged with the data signal supplied through the TFT, and when the TFT is turned off, the storage capacitor may hold an electric field generated between the pixel electrode and the touch electrode TE by using a charged voltage.

Each of the plurality of touch electrodes TE may act as a touch sensor for sensing a touch performed by a touch object, or may act as a common electrode for generating an electric field along with the pixel electrode to drive a liquid crystal. That is, each of the plurality of touch electrodes TE may be used as the touch sensor in the touch sensing mode and may be used as the common electrode in the display mode. Also, since each of the plurality of touch electrodes TE is used as the common electrode for driving the liquid crystal, the plurality of touch electrodes TE may be formed of a transparent conductive material such as indium tin oxide (ITO). The touch object may be defined as a user finger or a touch pen such as an active pen.

Since each of the plurality of touch electrodes TE is used as a self-capacitive touch sensor in the touch sensing mode, each of the plurality of touch electrodes TE may have a size which is larger than a minimum contact size between the touch object and the display panel 100. Therefore, each of the plurality of touch electrodes TE may have a size corresponding to a size of one or more subpixels SP.

Each of the plurality of touch routing lines TL may be individually connected to a corresponding touch electrode of the plurality of touch electrodes TE. Each of the plurality of touch routing lines TL may transfer a common voltage Vcom to a corresponding touch electrode TE in the display mode, and in the touch sensing mode, each of the plurality of touch routing lines TL may transfer a touch driving pulse to the corresponding touch electrode TE and may transfer a capacitance variation of the corresponding touch electrode TE to the display driver.

The display area 101 may be divided into n (where n is a natural number equal to or more than two) number of horizontal blocks (for example, first to nth horizontal blocks) HB1 to HBn. In the display area 101, an image may be displayed or touch sensing may be performed by units of horizontal blocks, based on time division driving. Each of the n horizontal blocks HB1 to HBn according to an aspect may include i (where i is a natural number equal to or more than two) number of gate lines GL (or horizontal lines), and the i gate lines GL may overlap one touch electrode TE. For example, the first horizontal block HB1 may include first to $i^{th}$ gate lines, and the second horizontal blocks HB2 may include $i+1^{th}$ to $2i^{th}$ gate lines.

The display driving part may time-divisionally drive the n horizontal blocks HB1 to HBn of the display area 101 of the display panel 100 and may include a data driving circuit 200 and a gate driving circuit 300 to driver the subpixels SP by units of horizontal blocks at every first period DP of a time division driving signal TDS.

In the touch sensing mode, the data driving circuit 200 may convert pixel data R/G/B into data signals of analog based on a data control signal DCS and may supply the analog data signal to the plurality of data lines DL.

The data driving circuit 200 according to an aspect may supply data signals to subpixels SP of a corresponding horizontal block through the plurality of data lines DL at every first period DP of the time division driving signal TDS.

According to another aspect, the data driving circuit 200 may supply data signals to subpixels SP of a corresponding horizontal block through the plurality of data lines DL at every first period DP of the time division driving signal TDS and may supply a data load free signal to each of the plurality of data lines DL at every second period TP of the time division driving signal TDS. Here, in the touch sensing mode, the data load free signal may have the same phase as that of the touch driving pulse supplied to the touch electrodes TE, and thus, may decrease loads of the touch electrodes TE caused by parasitic capacitances between the touch electrodes TE and the data lines DL, thereby enhancing touch sensitivity.

In a process of forming TFTs provided in the subpixels SP, the gate driving circuit 300 may be embedded (or integrated) into one non-display area of the display panel 100 and may be connected to the plurality of gate lines GL in a one-to-one relationship. The gate driving circuit 300 may generate a scan pulse and may supply the scan pulse to a corresponding gate line GL in a predetermined order, based on a gate control signal GCS. The scan pulse supplied to each of the gate lines GL may be synchronized with a data signal supplied to a corresponding data line.

The gate driving circuit 300 according to an aspect may sequentially supply the scan pulse to the i gate lines included in a horizontal block group by units of horizontal blocks at every first period DP of the time division driving signal TDS.

According to another aspect, the gate driving circuit 300 may sequentially supply the scan pulse to the i gate lines included in the horizontal block group by units of horizontal blocks at every first period DP of the time division driving signal TDS and may supply a gate load free signal to each of the plurality of gate lines GL in the touch sensing mode, for example, at every second period TP of the time division driving signal TDS. Here, in the touch sensing mode, the gate load free signal may have the same phase as that of the touch driving pulse supplied to the touch electrodes TE, and thus, may decrease loads of the touch electrodes TE caused by parasitic capacitances between the touch electrodes TE and the gate lines GL, thereby enhancing touch sensitivity.

The display driving part according to the present disclosure may further include a timing control circuit 400 and a power generation circuit 500.

The timing control circuit 400 may receive a timing synchronization signal TSS and input data Idata supplied from a host controller (or a host system) and may align the input data Idata to generate pixel data R/G/B suitable for the time division driving of the display panel 100, based on the timing synchronization signal TSS and may supply the pixel data R/G/B to the data driving circuit 200.

The timing control circuit 400 may generate the time division driving signal TDS for time-divisionally driving the display panel 100 by units of horizontal blocks, based on the timing synchronization signal TSS. The time division driving signal TDS according to an aspect may include the first period DP and the second period TP which are each performed twice or more during one frame, based on a vertical synchronization signal of the timing synchronization signal TSS. The time division driving signal TDS may be generated in order that the second period TP to start prior to the first period DP. Here, the first period DP of the time division driving signal TDS may be defined as a display period, and the second period TP of the time division driving signal TDS may be defined as a touch sensing period.

Moreover, the timing control circuit 400 may generate and output the data control signal DCS and the gate control signal GCS, based on the timing synchronization signal TSS and the time division driving signal TDS. Here, the data control signal DCS may include a source start signal, a source shift signal, a source enable signal, and a polarity control signal. Also, the gate control signal GCS may include first to fourth gate start signals, first to eighth gate shift clocks, first to fourth carry clocks, first to fourth dummy clocks, and first to fourth stage reset clocks.

Optionally, the time division driving signal TDS may be generated by the host controller (or the host system) and may be provided to the timing control circuit 400.

The power generation circuit 500 may generate and output various kinds of voltages such as a circuit driving voltage, a pixel driving voltage, a first driving voltage Vdd, a second driving voltage Vss necessary for driving of the display apparatus, based on an input voltage Vin. Here, the first driving voltage (or a first stage driving voltage) Vdd according to an aspect may be set to a constant voltage level of 20 V, but is not limited thereto. The second driving voltage (or a second stage driving voltage) Vss according to an aspect may be set to a constant voltage level of −10 V, but is not limited thereto. The second driving voltage Vss may be used as a gate-off voltage for turning off a TFT provided in each of the pixels.

The power generation circuit 500 according to the present disclosure may be implemented with a power management integrated circuit (IC).

Additionally, the power generation circuit 500 according to the present disclosure may further include a common voltage generation circuit which generates the common voltage Vcom, a touch driving pulse generation circuit which generates the touch driving pulse, a first load free signal generation circuit which generates the data load free signal, and a second load free signal generation circuit which generates the gate load free signal. Here, the common voltage generation circuit and the touch driving pulse generation circuit may be embedded into the touch driving circuit 600. The common voltage generation circuit, the touch driving pulse generation circuit, the first load free signal generation circuit, and the second load free signal generation circuit may be implemented as a touch power IC.

The touch driving circuit 600 may be connected to the plurality of touch electrodes TE through the plurality of touch routing lines TL provided in the display panel 100. In the display mode based on the first period DP of the time division driving signal TDS supplied from the timing control circuit 400, the touch driving circuit 600 may supply the common voltage Vcom to the plurality of touch electrodes TE through the plurality of touch routing lines TL. Also, the touch driving circuit 600 may sense a touch, performed by the touch object, through touch electrodes TE of a horizontal block by units of horizontal blocks according to the second period TP of the time division driving signal TDS.

In the touch sensing mode based on the second period TP of the time division driving signal TDS, the touch driving circuit 600 according to an aspect may supply the touch driving pulse to the plurality of touch electrodes TE through the plurality of touch routing lines TL, and then, may sense a capacitance variation of a corresponding touch electrode TE through each of the plurality of touch routing lines TL to generate touch raw data and may provide the generated touch raw data to the host controller (or the host system).

According to another aspect, in the touch sensing mode based on the second period TP of the time division driving signal TDS, the touch driving circuit 600 may sense a pen touch in a pen sensing period and may sense a finger touch in a finger touch period. For example, the touch driving circuit 600 may supply an uplink signal including a touch pen synchronization signal to touch electrodes TE of a corresponding horizontal block at every pen sensing period set in some of a set of second periods TP in one frame and may sense a signal transmitted from the touch pen through corresponding touch electrodes TE to generate touch raw data corresponding to a pen touch position. At this time, the touch pen may receive the touch pen synchronization signal through a conductive tip and may transmit a downlink signal including pen position data to the display panel 100, based on the received touch pen synchronization signal. Also, the touch driving circuit 600 may supply the touch driving pulse to touch electrodes TE of a corresponding horizontal block at every finger sensing period set in the other periods of the set of second periods TP in one frame and may sense a capacitance variation of a corresponding touch electrode TE to generate touch raw data corresponding to a finger touch position.

The host controller may receive touch raw data supplied from the touch driving circuit 600, generate two-dimensional (2D) or three-dimensional (3D) touch coordinate information from the touch raw data by executing a predetermined algorithm, and execute an application corresponding to the touch coordinate information. Here, the host controller may be a micro controller unit (MCU) or an application processor.

Additionally, the display apparatus according to an aspect of the present disclosure may further include a level shifter which shifts a level of the gate control signal GCS.

Based on the first driving voltage Vdd and the second driving voltage Vss, the level shifter may change a high voltage level of the gate control signal GCS to the first driving voltage Vdd, change a low voltage level of the gate control signal GCS to the second driving voltage Vss, and supply the first driving voltage Vdd or the second driving voltage Vss to the gate driving circuit 300. The level shifter may be embedded into the timing control circuit 400.

Figure 4:
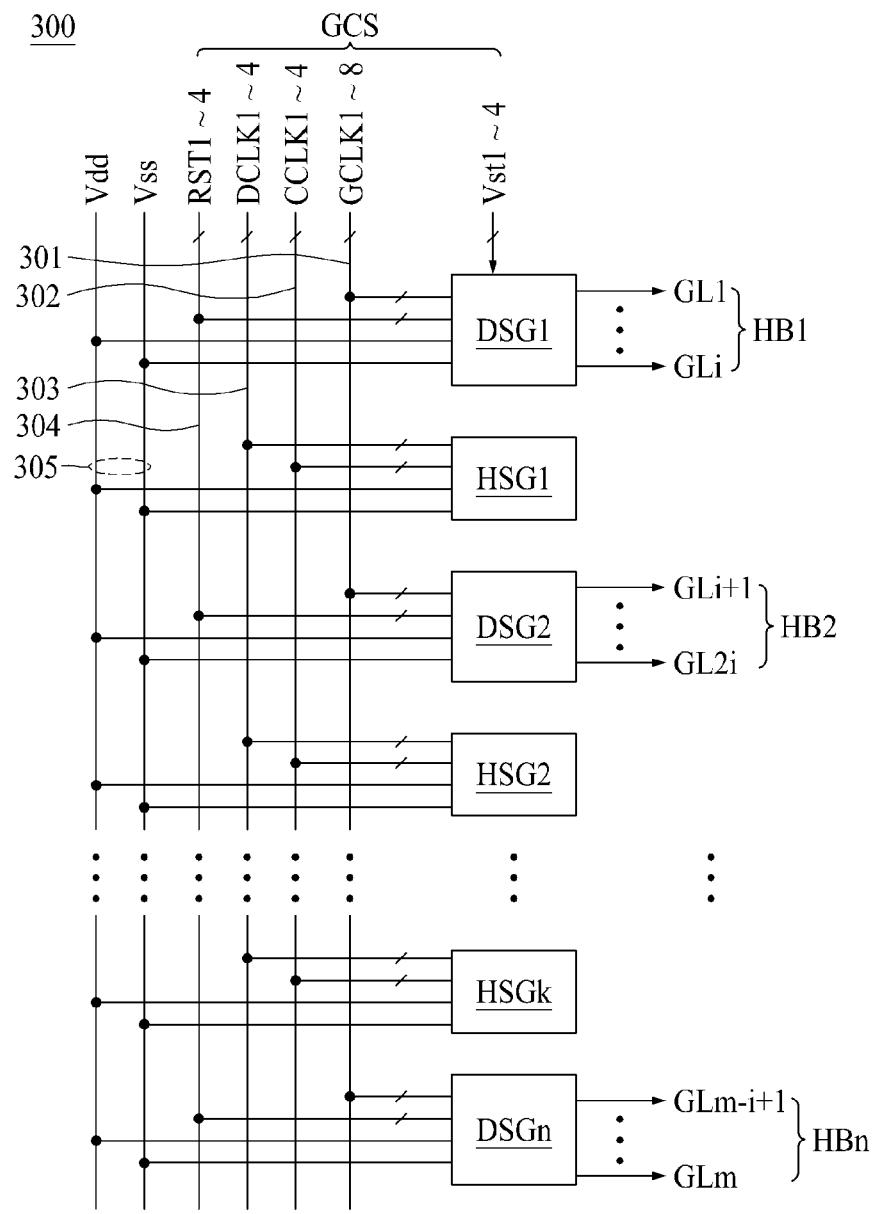
FIG. 4 is a diagram for describing a gate driving circuit according to an aspect of the present disclosure.
Figure 5:
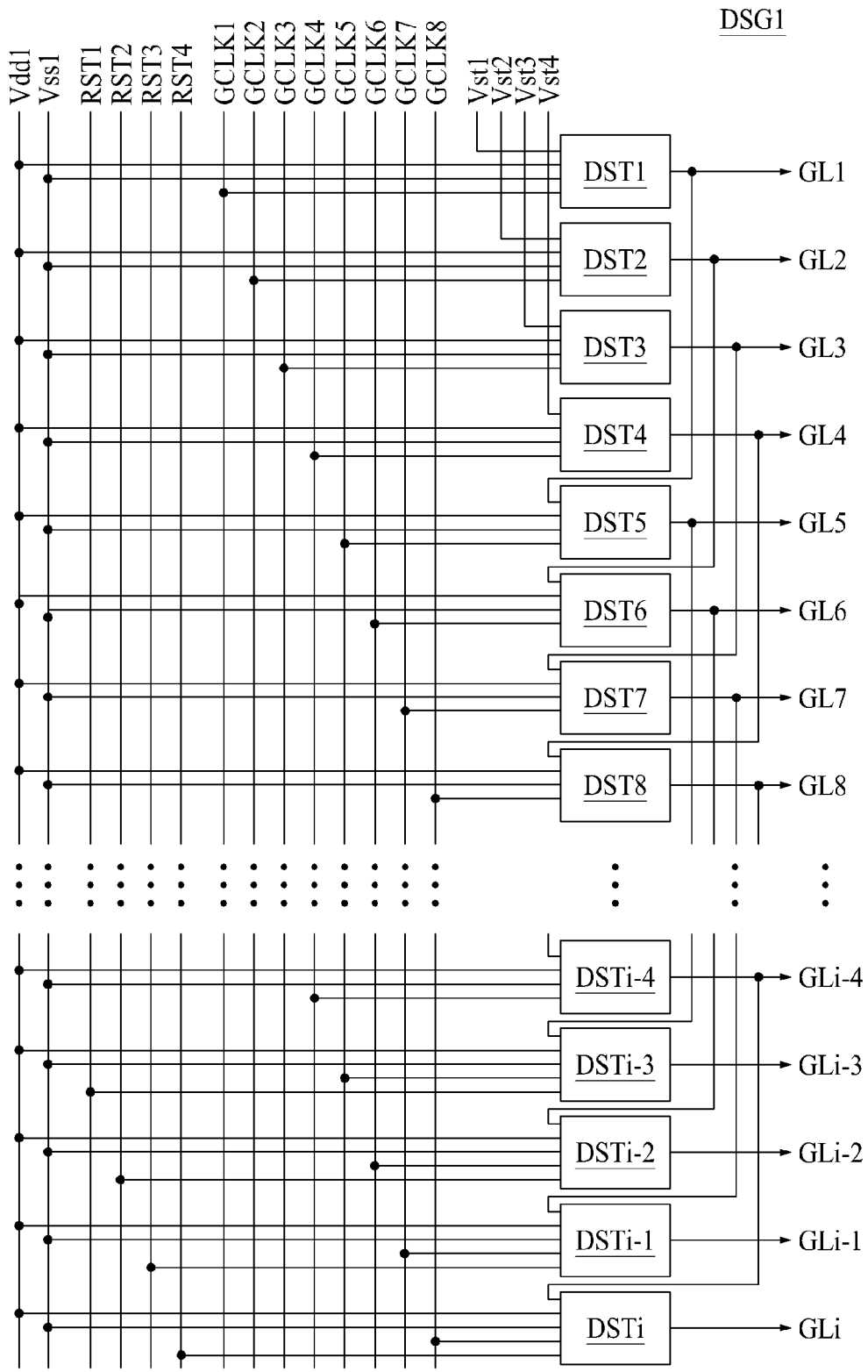
FIG. 5 is a diagram for describing a first driving stage group according to an aspect illustrated in FIG. 4.
Figure 6:
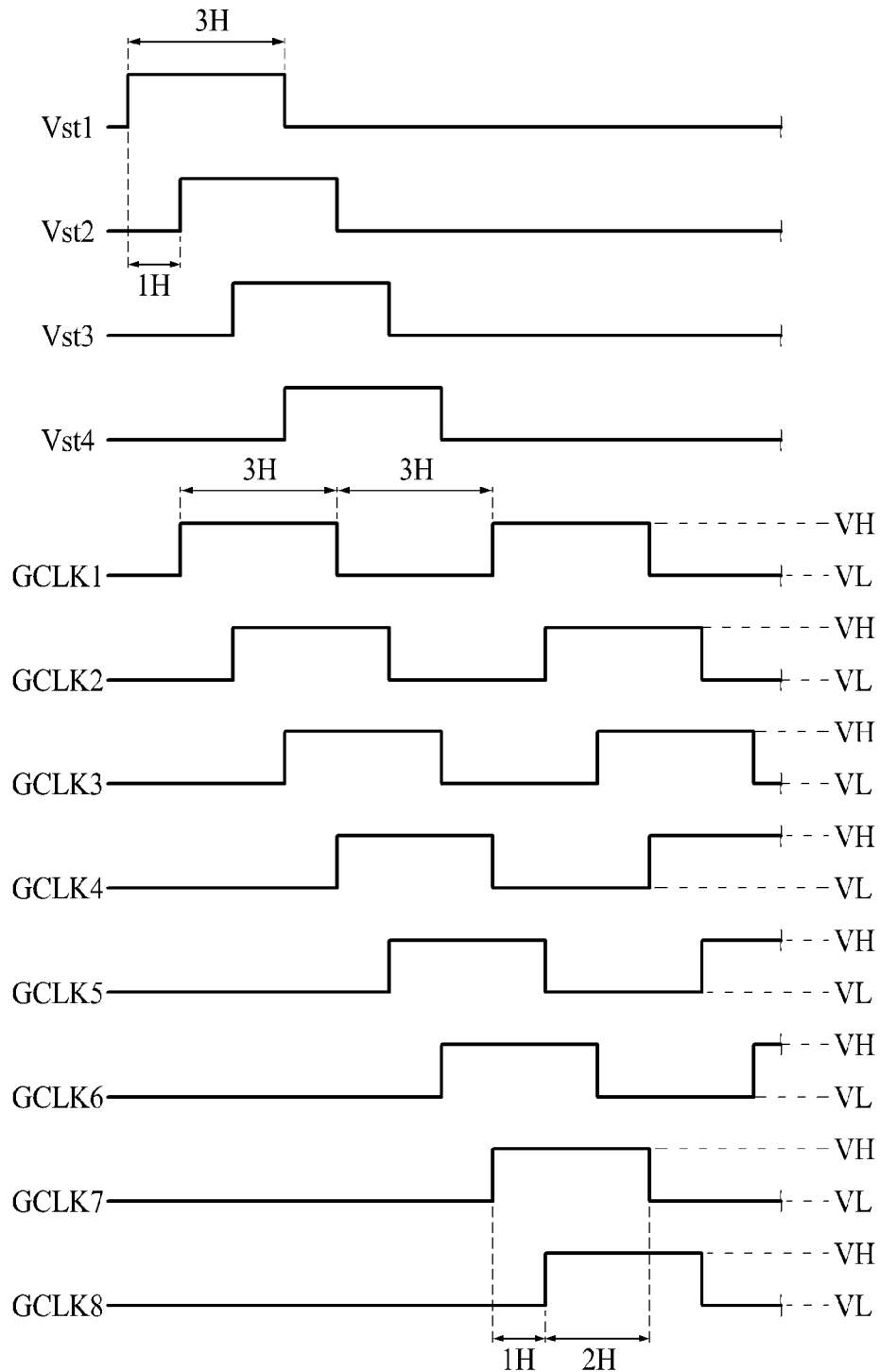
FIG. 6 is a waveform diagram showing a plurality of gate start signals and a plurality of gate shift clocks illustrated in FIG. 4.
Figure 7:
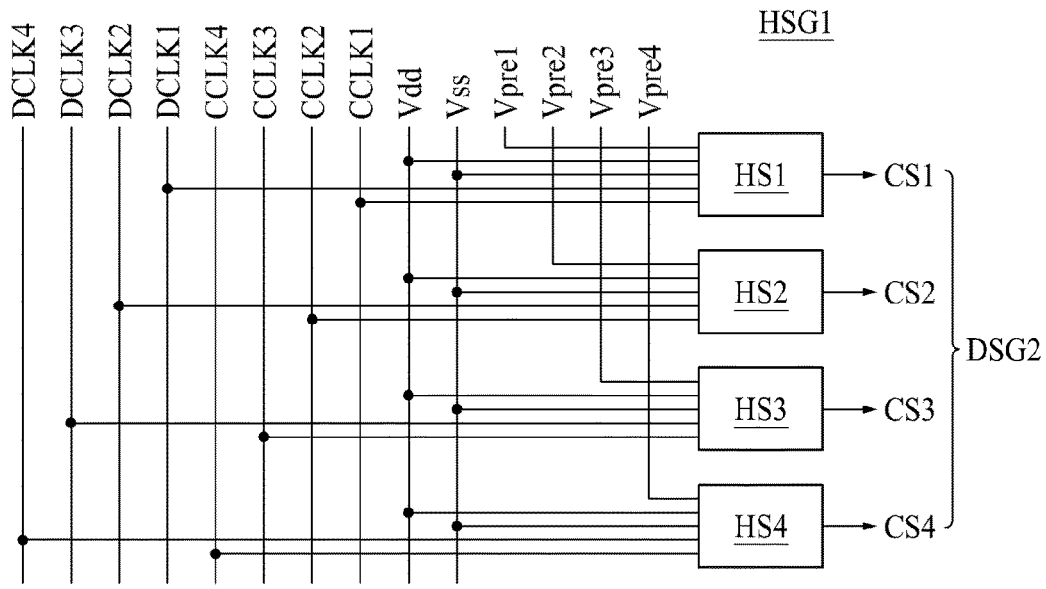
FIG. 7 is a diagram for describing a first holding stage group according to an aspect illustrated in FIG. 4.

FIG. 4 is a diagram for describing a gate driving circuit 300 according to an aspect of the present disclosure. FIG. 5 is a diagram for describing a first driving stage group according to an aspect illustrated in FIG. 4. FIG. 6 is a waveform diagram showing a plurality of gate start signals and a plurality of gate shift clocks illustrated in FIG. 4. FIG. 7 is a diagram for describing a first holding stage group according to an aspect illustrated in FIG. 4.

Referring to FIGS. 4 to 7, the gate driving circuit 300 according to an aspect of the present disclosure may include n number of driving stage groups DSG1 to DSGn, k (where k is a natural number equal to "n−1") number of holding stage groups HSG1 to HSGk, a shift clock line part 301, a carry clock line part 302, a dummy clock line part 303, a reset clock line part 304, and a power line part 305.

Each of the n driving stage groups DSG1 to DSGn may sequentially supply a scan pulse to i number of gate lines GL included in a corresponding horizontal block of horizontal blocks HB1 to HBn during a first period of a time division driving signal. Each of the n driving stage groups DSG1 to DSGn according to an aspect may include i number of driving stages DST1 to DSTi. In this case, the gate driving circuit 300 may include a number of driving stages corresponding to the total number of gate lines.

Each of the i driving stages DST1 to DSTi may include an output node connected to each of the i gate lines GL. For example, first to $i^{th}$ driving stages DST1 to DSTi of a first driving stage group DSG1 may be respectively connected to first to $i^{th}$ gate lines GL1 to GLi.

Each of first to fourth driving stages DST1 to DST4 may be enabled by a corresponding gate start signal of first to fourth gate start signals Vst1 to Vst4 and may supply, as the scan pulse, a corresponding gate shift clock of first to fourth gate shift clocks GCLK1 to GCLK4 to each of first to fourth gate lines GL1 to GL4. Also, each of the first to fourth driving stages DST1 to DST4 may be reset by an output signal of a corresponding driving stage of fifth to eighth driving stages DST5 to DST8.

Each of the fifth to i-$4^{th}$ driving stages DST5 to DSTi−4 may be enabled by an output signal (GLj−4) of a corresponding previous fourth driving stage (DSTj−4) and may supply, as the scan pulse, a corresponding gate shift clock GCLK to each of fifth to i-$4^{th}$ gate lines GL5 to GLi−4. Also, each of the fifth to i-$4^{th}$ driving stages DST5 to DSTi−4 may be reset by an output signal of a corresponding next fourth driving stage.

Each of i-$3^{th}$ to $i^{th}$ driving stages DSTi−3 to DSTi may be enabled by an output signal of a corresponding previous fourth driving stage and may supply, as the scan pulse, a corresponding gate shift clock GCLK to each of i-$3^{th}$ to $i^{th}$ gate lines GLi−3 to GLi. Also, the i-$3^{th}$ to $i^{th}$ driving stages DSTi−3 to DSTi may be respectively reset by corresponding first to fourth stage reset clocks RST1 to RST4. For example, i-$3^{th}$ and i-$2^{th}$ driving stages DSTi−3 and DSTi−2 may be respectively reset by the first stage reset clock RST1 and the second stage reset clock RST2, and i-$1^{th}$ and $i^{th}$ driving stages DSTi−1 and DSTi may be simultaneously reset by the third stage reset clock RST3 and the fourth stage reset clock RST4. Optionally, the i-$3^{th}$ and i-$2^{th}$ driving stages DSTi−3 and DSTi−2 may be simultaneously reset by the second stage reset clock RST2, and the i-$1^{th}$ and $i^{th}$ driving stages DSTi−1 and DSTi may be simultaneously reset by the fourth stage reset clock RST4. Also, the i-$3^{th}$ and i-$1^{th}$ driving stages DSTi−3 and DSTi−1 may be simultaneously reset by the second stage reset clock RST2, and the i-$2^{th}$ and $i^{th}$ driving stages DSTi−2 and DSTi may be simultaneously reset by the fourth stage reset clock RST4.

An output signal of each of the first to $i^{th}$ driving stages DST1 to DSTi may be supplied as a gate start signal of a next fourth driving stage. An output signal of each of the fifth to $i^{th}$ driving stages DST5 to DSTi may be supplied as a stage reset signal of a previous fourth driving stage.

Each of the k holding stage groups HSG1 to HSGk may be disposed between the n driving stage groups DSG1 to DSGn. Each of the, and during a second period of the time division driving signal, an $h^{th}$ holding stage group HSGh (h between 1 and k inclusive) from the k holding stage groups HSG1 to HSGk may sequentially supply four carry signals CS1 to CS4 the h+$1^{th}$ to driving stage group DSGh+1 following the $h^{th}$ holding stage group according to a voltage of a holding node, a voltage of a first control node, and a voltage of a second control node, which are based on an input voltage including first to fourth carry clocks CCLK1 to CCLK4, a first driving voltage Vdd, a second driving voltage Vss, four output signals Vpre1 to Vpre4 supplied from the $h^{th}$ driving stage group DSGh preceding the $h^{th}$ holding stage group, and first to fourth dummy clocks DCLK1 to DCLK4. The four carry signals CS1 to CS4 may be respectively applied as gate start signals Vst1 to Vst4 to first to fourth driving stages of the rear driving stage group. For example, four carry signals CS1 to CS4 sequentially output from a first holding stage group HSG1 may be respectively applied as first to fourth gate start signals Vst1 to Vst4 to first to fourth driving stages of a second driving stage group DSG2. Also, four carry signals CS1 to CS4 sequentially output from a $k^{th}$ holding stage group HSGk may be respectively applied as first to fourth gate start signals Vst1 to Vst4 to first to fourth driving stages of an $n^{th}$ driving stage group DSGn.

Each of the k holding stage groups HSG1 to HSGk may include first to fourth holding stages HS1 to HS4.

Each of the first to fourth holding stages HS1 to HS4 may charge a voltage into a holding capacitor in response to a corresponding output signal of four output signals Vpre1 to Vpre4 supplied from a driving stage group preceding the holding stage group and may supply, as carry signals CS1 to CS4, a corresponding carry clock of the first to fourth carry clocks CCLK1 to CCLK4 to a corresponding driving stage of first to fourth driving stages of each of a driving stage groups following the holding stage group, based on the voltage charged into the holding capacitor. Also, each of the first to fourth holding stages HS1 to HS4 may be reset by a corresponding output signal of output signals of the first to fourth driving stages of the driving stage groups following the holding stage group.

Each of the first to fourth holding stages HS1 to HS4 according to an aspect may include an output node sequentially connected to the first to fourth driving stages of each of the rear driving stage groups DSG2 to DSGn. For example, the first holding stage HS1 of each of the k holding stage groups HSG1 to HSGk may be connected to the first driving stage of each of the driving stage groups DSG2 to DSGn following each of the holding stage groups HSG1 to HSGk, and the fourth holding stage HS4 of each of the k holding stage groups HSG1 to HSGk may be connected to the fourth driving stage of each of the driving stage groups DSG2 to DSGn following each of the holding stage groups HSG1 to HSGk.

The shift clock line part 301 may include first to eighth shift clock lines which are supplied with first to eighth gate shift clocks GCLK1 to GCLK8 having a sequentially shifted phase from the timing control circuit. In this case, a $j^{th}$ (where j is a natural number from one to eight) shift clock line may be connected to an 8a-$b^{th}$ (where a is a natural number, and b is a natural number equal to "8−j") driving stage DST8a-b. Therefore, a $j^{th}$ gate shift clock may be supplied to the 8a-b$^{th}$ driving stage DST8a-b through the $j^{th}$ shift clock line.

Each of the first to eighth gate shift clocks GCLK1 to GCLK8 may include a first voltage period and a second voltage period which are repeated at a predetermined interval. Here, the first voltage period may have a high voltage level VH for turning on a transistor, and the second voltage period may have a low voltage level VL for turning off a transistor. The first voltage period and the second voltage period of each of the first to eighth gate shift clocks GCLK1 to GCLK8 may each have three horizontal periods 3H. The first voltage period of each of the first to eighth gate shift clocks GCLK1 to GCLK8 may be shifted by one horizontal period, and thus, may overlap a first voltage period of an adjacent gate shift clock during two horizontal periods 2H. Optionally, the first voltage period and the second voltage period may each have four horizontal periods 4H, and may overlap a first voltage period of an adjacent gate shift clock during three horizontal periods 3H.

The carry clock line part 302 may include first to fourth carry clock lines which are supplied with the first to fourth carry clocks CCLK1 to CCLK4 having a sequentially shifted phase from the timing control circuit. In this case, each of the first to fourth carry clock lines may be connected to a corresponding holding stage of the first to fourth holding stages HS1 to HS4 of each of the k holding stage groups HSG1 to HSGk. Therefore, each of the first to fourth carry clocks CCLK1 to CCLK4 may be supplied to a corresponding holding stage of the first to fourth holding stages HS1 to HS4 of each of the k holding stage groups HSG1 to HSGk.

Each of the first to fourth carry clocks CCLK1 to CCLK4 may rise from a low voltage level VL to a high voltage level VH immediately after the second period of the time division driving signal ends or at a start time of the first period of the time division driving signal, and after a predetermined period, may fall from the high voltage level VH to the low voltage level VL. In this case, each of the first to fourth carry clocks CCLK1 to CCLK4 may be generated once immediately after each of a plurality of second periods included in the time division driving signal ends or at a start time of each of a plurality of first periods included in the time division driving signal, in one frame period. For example, each of the first to fourth carry clocks CCLK1 to CCLK4 may be generated immediately after each of a plurality of touch sensing periods ends or at a start time of each of a plurality of display periods, and may be shifted by one horizontal period. For example, each of the first to fourth carry clocks CCLK1 to CCLK4 may have a high voltage period corresponding to three horizontal periods.

The dummy clock line part 303 may include first to fourth dummy clock lines which are supplied with the first to fourth dummy clocks DCLK1 to DCLK4 having a sequentially shifted phase from the timing control circuit. In this case, each of the first to fourth dummy clock lines may be connected to a corresponding holding stage of the first to fourth holding stages HS1 to HS4 of each of the k holding stage groups HSG1 to HSGk. Therefore, each of the first to fourth dummy clocks DCLK1 to DCLK4 may be supplied to a corresponding holding stage of the first to fourth holding stages HS1 to HS4 of each of the k holding stage groups HSG1 to HSGk.

Each of the first to fourth dummy clocks DCLK1 to DCLK4 may include a high voltage period for charging a holding node and a second high voltage period for charging a first control node. For example, each of the first to fourth dummy clocks DCLK1 to DCLK4 may have a high voltage period corresponding to six horizontal periods, and each of the first high voltage period and the second high voltage period may have three horizontal periods.

The second high voltage period of each of the first to fourth dummy clocks DCLK1 to DCLK4 may overlap each of the first to fourth carry clocks CCLK1 to CCLK4. For example, a high voltage period of the first carry clock CCLK1 may overlap a second high voltage period of the first dummy clock DCLK1.

The reset clock line part 304 may include first to fourth reset clock lines which are supplied with the first to fourth stage reset clocks RST1 to RST4 having a sequentially shifted phase from the timing control circuit. In this case, each of the first to fourth reset clock lines may be connected to a corresponding driving stage of the i-3$^{th}$ to i$^{th}$ driving stages DSTi-3 to DSTi of each of the n driving stage groups DSG1 to DSGn and may be connected to a corresponding holding stage of the first to fourth holding stages HS1 to HS4 of each of the k holding stage groups HSG1 to HSGk. Therefore, each of the first to fourth stage reset clocks RST1 to RST4 may be supplied to a corresponding driving stage of the i-3$^{th}$ to i$^{th}$ driving stages DSTi-3 to DSTi of each of the n driving stage groups DSG1 to DSGn and may be supplied to a corresponding holding stage of the first to fourth holding stages HS1 to HS4 of each of the k holding stage groups HSG1 to HSGk. For example, each of the first to fourth stage reset clocks RST1 to RST4 may have a high voltage period corresponding to three horizontal periods.

The power line part 305 may include first and second driving voltage lines which are respectively supplied with a first driving voltage Vdd and a second driving voltage Vss from the power generation circuit.

The first driving voltage Vdd may be supplied to, through the first driving voltage line, the driving stages included in each of the n driving stage groups DSG1 to DSGn and the holding stages included in each of the k holding stage groups HSG1 to HSGk.

The second driving voltage Vss may be supplied to, through the second driving voltage line, the driving stages included in each of the n driving stage groups DSG1 to DSGn and the holding stages included in each of the k holding stage groups HSG1 to HSGk. Additionally, the second driving voltage Vss may be changed to a gate load free signal during the touch sensing period, and at this time, the gate load free signal may have a voltage level lower than the second driving voltage Vss and may have the same phase as that of a touch driving pulse.

Figure 8:
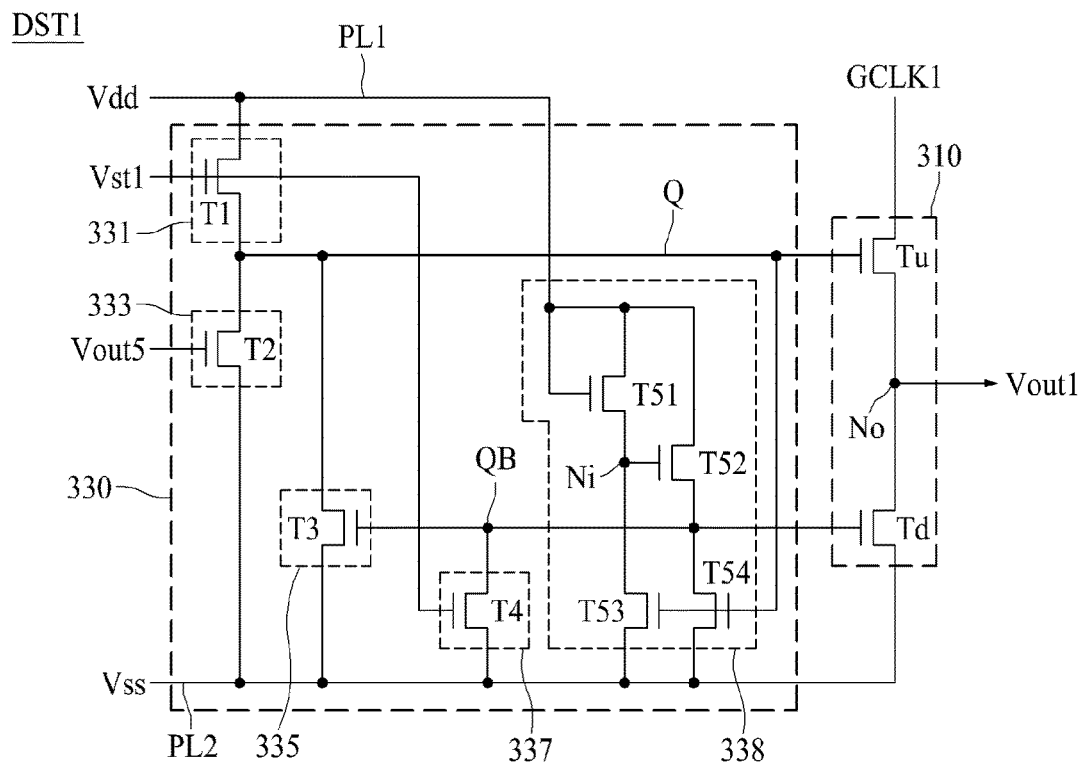
FIG. 8 is a diagram for describing an internal configuration of a first driving stage illustrated in FIG. 5.

FIG. 8 is a diagram for describing an internal configuration of the first driving stage DST1 illustrated in FIG. 5.

Referring to FIGS. 5 and 8, the first driving stage DST1 according to the present aspect may include a scan output part 310 and a scan node controller 330.

The scan output part 310 may output a first scan pulse Vout1, based on a voltage of each of a first node Q and a second node QB. The scan output part 310 according to an aspect may include a pull-up TFT Tu and a pull-down TFT Td.

The pull-up TFT Tu may include a gate terminal connected to the first node Q, a first terminal receiving the first gate shift clock GCLK1, and a second terminal connected to an output node No. The pull-up TFT Tu may be turned on based on the voltage of the first node Q and may output a high voltage level VH of the first gate shift clock GCLK1 as the first scan pulse Vout1. The first scan pulse Vout1 may be supplied to a first gate line, and simultaneously, may be supplied as a gate start signal of a fifth driving stage.

The pull-down TFT Td may include a gate terminal connected to the second node QB, a first terminal receiving the second driving voltage Vss, and a second terminal connected to the output node No. The pull-down TFT Td may be turned on based on the voltage of the second node QB and may supply the second driving voltage Vss, supplied through a second driving voltage line PL2, as a gate-off voltage to the first gate line through the output node No. That is, the pull-down TFT Td may be turned on based on the voltage of the second node QB and may discharge a voltage of the first gate line to the second driving voltage line PL2.

The scan node controller 330 may control the voltage of each of the first node Q and the second node QB, based on the first gate start pulse Vst1, an output signal Vout5 of the fifth driving stage, the first driving voltage Vdd, and the second driving voltage Vss. The scan node controller 330 according to an aspect may include a node set circuit 331, a first reset circuit 333, a noise removal circuit 335, a second reset circuit 337, and an inverter circuit 338.

The node set circuit 331 may control the voltage of the first node Q in response to the first gate start pulse Vst1. The node set circuit 331 according to an aspect may include a first TFT T1. The first TFT T1 may include a gate terminal receiving the first gate start pulse Vst1, a first terminal connected to a first driving voltage line PL1, and a second terminal connected to the first node Q. The first TFT T1 may be turned on by the first gate start pulse Vst1 and may charge the first driving voltage Vdd, supplied through the first driving voltage line PL1, into the first node Q.

The first reset circuit 333 may control the voltage of the first node Q in response to the output signal Vout5 of the fifth driving stage. The first reset circuit 333 according to an aspect may include a second TFT T2. The second TFT T2 may include a gate terminal receiving the output signal Vout5 of the fifth driving stage, a first terminal connected to the second driving voltage line PL2, and a second terminal connected to the second node QB. The second TFT T2 may be turned on by the output signal Vout5 of the fifth driving stage and may discharge the voltage of the first node Q to the second driving voltage line PL2.

The noise removal circuit 335 may control the voltage of the first node Q in response to the voltage of the second node QB. The noise removal circuit 335 according to an aspect may include a third TFT T3. The third TFT T3 may include a gate terminal connected to the second node QB, a first terminal connected to the second driving voltage line PL2, and a second terminal connected to the first node Q. The third TFT T3 may be turned on by the voltage of the second node QB and may discharge the voltage of the first node Q to the second driving voltage line PL2. The third TFT T3 may discharge the voltage of the first node Q to the second driving voltage line PL2 while the pull-up TFT Tu of the scan output part 310 maintains a turn-off state, and thus, may remove noise, which occurs in the first node Q due to coupling between a gate electrode and a source electrode of the pull-up TFT Tu, at every rising period of the first gate shift clock GCLK1 supplied to the pull-up TFT Tu.

The second reset circuit 337 may control the voltage of the second node QB in response to the first gate start pulse Vst1. The second reset circuit 337 according to an aspect may include a fourth TFT T4. The fourth TFT T4 may include a gate terminal receiving the first gate start pulse Vst1, a first terminal connected to the second driving voltage line PL2, and a second terminal connected to the second node QB. The fourth TFT T4 may be turned on by the first gate start pulse Vst1 and may discharge the voltage of the second node QB to the second driving voltage line PL2.

The inverter circuit 338 may control the voltage of the second node QB in response to the voltage of the first node Q. That is, the inverter circuit 338 may charge the first driving voltage Vdd, supplied through the first driving voltage line PL1, into the second node QB in response to the voltage of the first node Q, or may discharge the voltage of the second node QB to the second driving voltage line PL2. The inverter circuit 338 according to an aspect may include $5-1^{th}$ to $5-4^{th}$ TFTs T51 to T54. The inverter circuit 338 may control the voltage of the second node QB to a voltage opposite to the voltage of the first node Q.

The $5-1^{th}$ TFT T51 may include a gate terminal and a first terminal connected to the first driving voltage line PL1 and a second terminal connected to an internal node Ni. The $5-1^{th}$ TFT T51 may be turned on by the first driving voltage Vdd supplied through the first driving voltage line PL1 and may supply the first driving voltage Vdd to the internal node Ni.

The $5-2^{th}$ TFT T52 may include a gate terminal connected to the internal node Ni, a first terminal connected to the first driving voltage line PL1, and a second terminal connected to the second node QB. The $5-2^{th}$ TFT T52 may be turned on/off based on a voltage of the internal node Ni, and when the $5-2^{th}$ TFT T52 is turned on, the $5-2^{th}$ TFT T52 may supply the first driving voltage Vdd, supplied through the first driving voltage line PL1, to the second node QB.

The $5-3^{th}$ TFT T53 may include a gate terminal connected to the first node Q, a first terminal connected to the second driving voltage line PL2, and a second terminal connected to the internal node Ni. The $5-3^{th}$ TFT T53 may be turned on/off based on the voltage of the first node Q, and when the $5-3^{th}$ TFT T53 is turned on, the $5-3^{th}$ TFT T53 may discharge the voltage of the internal node Ni to the second driving voltage line PL2.

The $5-4^{th}$ TFT T54 may include a gate terminal connected to the first node Q, a first terminal connected to the second driving voltage line PL2, and a second terminal connected to the second node QB. The $5-4^{th}$ TFT T54 may be turned on/off based on the voltage of the first node Q, and when the $5-4^{th}$ TFT T54 is turned on, the $5-4^{th}$ TFT T54 may discharge the voltage of the second node QB to the second driving voltage line PL2.

When each of the $5-3^{th}$ TFT T53 and the $5-4^{th}$ TFT T54 is turned off based on the voltage of the first node Q, the inverter circuit 338 may charge the first driving voltage Vdd into the internal node Ni through the $5-1^{th}$ TFT T51 turned on by the first driving voltage Vdd and may charge the first driving voltage Vdd into the second node QB through the $5-2^{th}$ TFT T52 turned on by the voltage of the internal node Ni. On the other hand, when each of the $5-3^{th}$ TFT T53 and the $5-4^{th}$ TFT T54 is turned on based on the voltage of the first node Q, the inverter circuit 338 may discharge the voltage of the internal node Ni to the second driving voltage line PL2 through the turned-on $5-3^{th}$ TFT T53 to turn off the $5-2^{th}$ TFT T52, and simultaneously, may discharge the voltage of the second node QB to the second driving voltage line PL2 through the turned-on $5-4^{th}$ TFT T54. At this time, even when the first driving voltage Vdd is supplied to the internal node Ni through the $5-1^{th}$ TFT T51 turned on by the first driving voltage Vdd, the voltage of the internal node Ni may be discharged to the second driving voltage line PL2 through the turned-on $5-3^{th}$ TFT T53, and thus, the $5-2^{th}$ TFT T52 connected to the internal node Ni may be turned off. To this end, the $5-3^{th}$ TFT T53 may have a channel size which is relatively larger than that of the $5-1^{th}$ TFT T51.

Each of the TFTs constituting the first driving stage DST1 according to the present aspect may include an oxide semiconductor layer such as zinc oxide (ZnO), indium zinc oxide (InZnO), or indium gallium zinc oxide (InGaZnO).

Hereinafter, an operation of the first driving stage DST1 according to the present aspect will be described with reference to FIGS. 6 and 8.

First, when the first gate start pulse Vst1 is supplied, the first TFT T1 of the node set circuit 331 may be turned on by the first gate start pulse Vst1, and the fourth TFT T4 of the second reset circuit 337 may be turned on. Therefore, the first node Q may be precharged with the first driving voltage Vdd supplied through the first TFT T1 turned on by the first gate start pulse Vst1, and the voltage of the second node QB may be discharged to the second driving voltage line PL2 through the fourth TFT T4 turned on by the first gate start pulse Vst1. Accordingly, the pull-up TFT Tu of the scan output part 310 may be turned on by the first driving voltage charged into the first node Q and may supply a low voltage level VL of the first gate shift clock GCLK1, supplied to a first shift clock line, to the first gate line through the output node No. At this time, the pull-down TFT Td of the scan output part 310 may be turned off by the voltage of the second node QB which is discharged to the second driving voltage line PL2 through the fourth TFT T4.

Subsequently, when the first gate shift clock GCLK1 having a high voltage level VH is supplied to the first shift clock line, the first gate shift clock GCLK1 having a high voltage level VH may be supplied to the pull-up TFT Tu of the scan output part 310, and thus, the first node Q precharged with the first driving voltage Vdd may be bootstrapped to increase to a higher voltage, whereby the pull-up TFT Tu of the scan output part 310 may be completely turned on. Therefore, the first gate shift clock GCLK1 having a high voltage level VH may be supplied as the first scan pulse Vout1 to the first gate line through the completely turned-on pull-up TFT Tu of the scan output part 310 without a voltage being lost. At this time, the voltage of the second node QB may be discharged to the second driving voltage line PL2 through each of the 5-3$^{th}$ TFT T53 and the 5-4$^{th}$ TFT T54, turned on by the voltage of the first node Q, of the inverter circuit 338, and thus, the pull-down TFT Td of the scan output part 310 may maintain a turn-off state.

Subsequently, an output signal Vout5 having a high voltage level VH is supplied from the fifth driving stage, the second TFT T2 of the first reset circuit 333 may be turned on by the output signal Vout5 of the fifth driving stage, and thus, the voltage of the first node Q may be discharged to the second driving voltage Vss through the second TFT T2, whereby the pull-up TFT Tu may be turned off. Simultaneously, in the inverter circuit 338, each of the 5-3$^{th}$ TFT T53 and the 5-4$^{th}$ TFT T54 may be turned off by the voltage of the first node Q, and thus, the first driving voltage Vdd may be supplied to the internal node Ni through the 5-1$^{th}$ TFT T51, the 5-2$^{th}$ TFT T52 may be turned on by the first driving voltage Vdd supplied to the internal node Ni, and the first driving voltage Vdd may be supplied to the second node QB through the 5-2$^{th}$ TFT T52 to turn on the pull-down TFT Td. Therefore, the voltage of the output node No may be discharged to the second driving voltage line PL2 by the turned-on pull-down TFT Td, and thus, the gate-off voltage may be supplied to the first gate line.

A configuration and an operation of each of the driving stages other than the first driving stage among the driving stages constitution each of the n driving stage groups DSG1 to DSGn are the same as the above-described first driving stage DST1, and thus, their descriptions are omitted.

Figure 9:
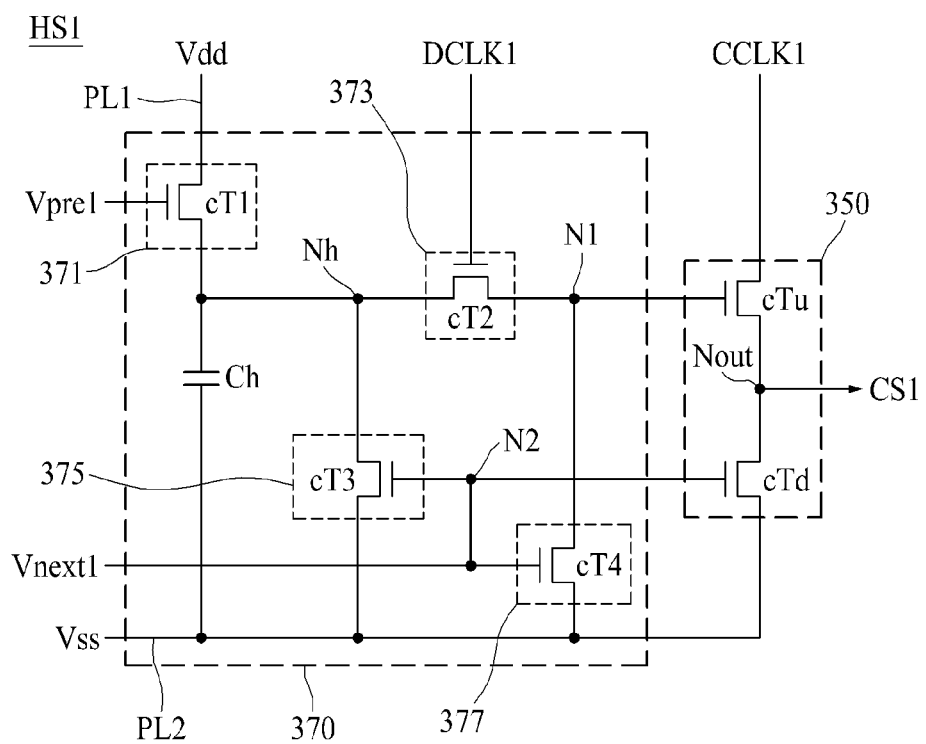
FIG. 9 is a diagram for describing an internal configuration of a first holding stage illustrated in FIG. 7.
Figure 10:
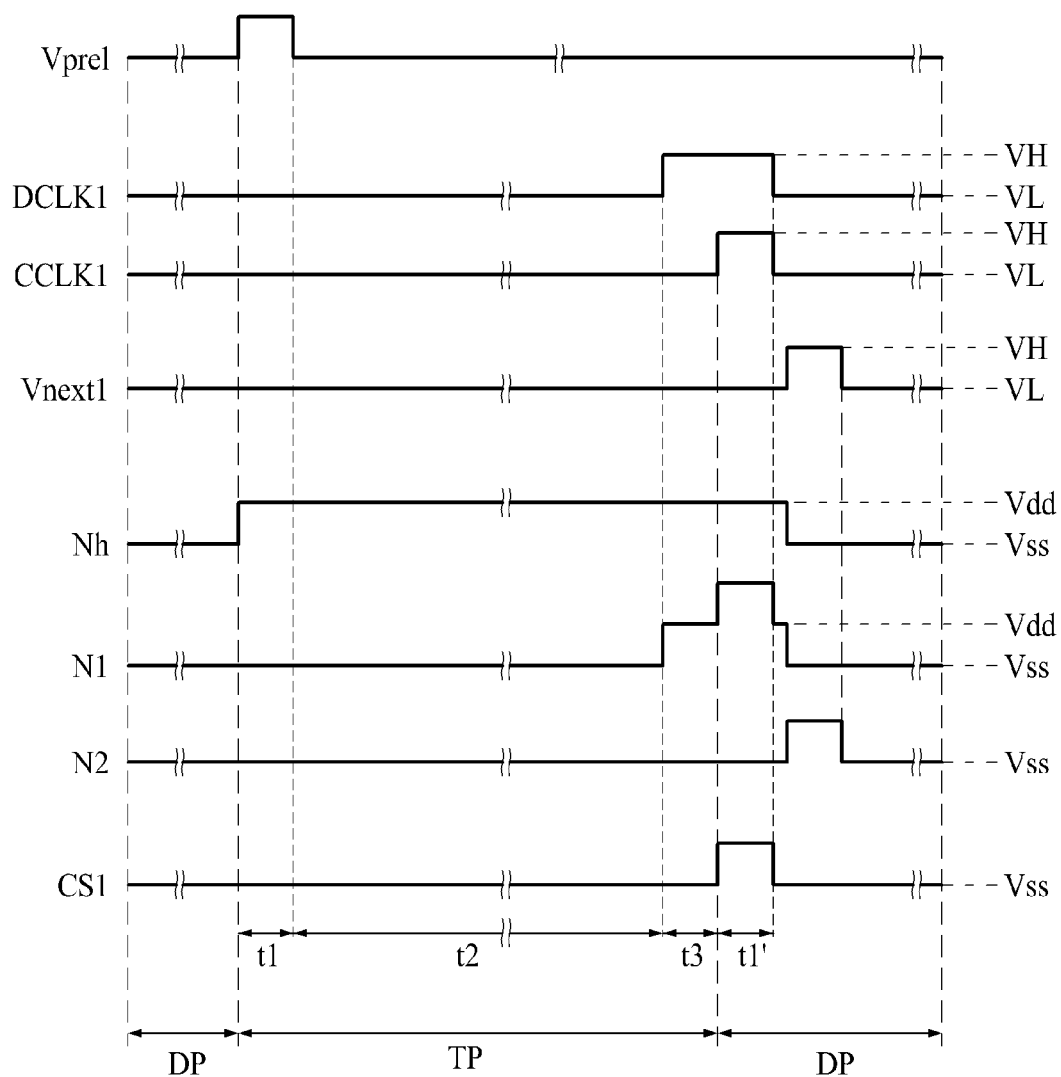
FIG. 10 is a driving waveform diagram of the first holding stage according to an aspect illustrated in FIG. 9.

FIG. 9 is a diagram for describing an internal configuration of the first holding stage HS1 illustrated in FIG. 7, and FIG. 10 is a driving waveform diagram of the first holding stage HS1 according to an aspect illustrated in FIG. 9.

Referring to FIGS. 7, 9, and 10, in response to the first output signal Vpre1 supplied from a front driving stage group, the first holding stage HS1 according to the present aspect may charge a holding voltage into a holding capacitor Ch and may output a first carry signal CS1 to a rear driving stage group, based on the holding voltage charged into the holding capacitor Ch. That is, the first holding stage HS1 may charge the first driving voltage Vdd into the holding capacitor Ch through a holding node Nh in response to the first output signal Vpre1 supplied from the front driving stage group, charge a first control node N1 with a voltage stored in the holding capacitor Ch in response to the first dummy clock DCLK1, and output the first carry clock CCLK1 as the first carry signal CS1 through an output node Nout in response to a charged voltage of the first control node N1. Also, the first holding stage HS1 may charge a second control node N2 with a first output signal Vnext1 supplied from the rear driving stage group, and may supply the second driving voltage Vss to the holding node Nh, the first control node N1, the holding capacitor Ch, and the output node Nout, based on a voltage of the second control node N2. Here, the first holding stage HS1 may charge the first output signal Vpre1 into the holding capacitor Ch in response to the first output signal Vpre1 supplied from the front driving stage group, and in this case, may not be connected to the first driving voltage line PL1. Therefore, a circuit size decreases as an area occupied by the first driving voltage line PL1 decreases.

The first holding stage HS1 according to an aspect may include a carry output part 350 and a carry node controller 370.

The carry output part 350 may output a first carry pulse CS1 or may discharge a voltage of an output node Nout to the second driving voltage line PL2, based on a voltage of each of a first control node N1 and a second control node N2. The carry output part 350 according to an aspect may include a first output transistor cTu and a second output transistor cTd.

The first output transistor cTu may include a gate terminal connected to the first control node N1, a first terminal receiving the first carry clock CCLK1, and a second terminal connected to the output node Nout. The first output transistor cTu may be turned on based on the voltage of the first control node N1, and may output a high voltage level VH of the first carry clock CCLK1 as the first carry signal CS1. The first carry signal CS1 may be supplied as a gate start signal to a first driving stage of the second driving stage group DSG2.

The second output transistor cTd may include a gate terminal connected to the second control node N2, a first terminal receiving the second driving voltage Vss from the second driving voltage line PL2, and a second terminal connected to the output node Nout. The second output transistor cTd may be turned on based on the voltage of the second control node N2 and may supply the second driving voltage Vss as a gate-off voltage to the first driving stage of the second driving stage group DSG2 through the output node Nout. That is, the second output transistor cTd may be turned on based on the voltage of the second control node N2 and may discharge a voltage of the output node Nout to the second driving voltage line PL2.

The carry node controller 370 may control the voltage of each of the first control node N1 and the second control node N2, based on an output signal (hereinafter referred to as a first holding start signal) Vpre1 supplied from a front fourth driving stage, an output signal (hereinafter referred to as a first holding reset signal) Vnext1 supplied from the rear driving stage group, and the first dummy clock DCLK1. Here, the first holding reset signal Vnext1 may be directly supplied to the second control node N2.

The carry node controller 370 according to an aspect may include first to fourth drivers 371, 373, 375, and 377 and the holding capacitor Ch. Here, the first driver 371 may be referred to as a holding node set circuit, the second driver 373 may be referred to as a first node set circuit, the third driver 375 may be referred to as a holding node reset circuit, and the fourth driver 375 may be referred to as a first node reset circuit.

The first driver 371 may supply the first driving voltage Vdd, supplied through the first driving voltage line PL, to the holding node Nh in response to the first holding start signal Vpre1. The first driver 371 according to an aspect may include a first transistor cT1. The first transistor cT1 may include a gate terminal receiving the first holding start signal Vpre1, a first terminal connected to the first driving voltage line PL, and a second terminal connected to the holding node Nh. The first transistor cT1 may be turned on by the first holding start signal Vpre1 and may charge the first driving voltage Vdd into the holding node Nh. Here, the second terminal of the first transistor cT1 may receive the first holding start signal Vpre1 without receiving the first driving voltage Vdd through the first driving voltage line PL.

The holding capacitor Ch may be connected between the holding node Nh and the second driving voltage line PL2. That is, the holding capacitor Ch may include a first capacitor electrode and a second capacitor electrode, which face each other with a dielectric therebetween. The first capacitor electrode may be connected to the holding node Nh, and the second capacitor electrode may be connected to the second driving voltage line PL2. The holding capacitor Ch may store a voltage difference between a voltage of the holding node Ch and the voltage Vss of the second driving voltage line PL2. The holding capacitor Ch may be charged with a precharging voltage of the first holding stage HS1 based on the output signal Vpre1 supplied from the front driving stage group, and may hold a charged voltage for a certain time to shorten a time for which the precharging voltage is supplied to the first control node N1, thereby reducing deterioration of the first output transistor cTu connected to the first control node N1. For example, when the holding capacitor Ch is not provided in the first holding stage HS1, the first driving voltage Vdd may be precharged into the first control node N1 instead of the holding node Nh, based on an operation of the first driver 371 based on the first holding start signal Vpre1, and the precharged voltage of the first control node N1 may be held for a long time until the first carry clock CCLK1 is supplied thereto, causing deterioration of the first output transistor cTu connected to the first control node N1. In an aspect of the present disclosure, in order to decrease the deterioration of the first output transistor cTu caused by the precharged voltage of the first control node N1 which is held for a long time, a voltage which is to be precharged into the first control node N1 may be charged into and held by the holding capacitor Ch, based on the first holding start signal Vpre1.

The second driver 373 may supply a voltage, charged into the holding capacitor Ch, to the first control node N1 to precharge the first control node N1 with the voltage charged into the holding capacitor Ch, in response to the first dummy clock DCLK1. The second driver 373 according to an aspect may include a second transistor cT2. The second transistor cT2 may include a gate terminal receiving the first dummy clock DCLK1, a first terminal connected to the holding node Nh, and a second terminal connected to the first control node N1. The second transistor cT2 may be turned on by the first dummy clock DCLK1 and may supply the voltage, charged into the holding capacitor Ch, to the first control node N1. Therefore, the first control node N1 may be precharged with the first driving voltage Vdd charged into the holding capacitor Ch.

The third driver 375 may initialize a voltage of the holding node Nh and a voltage of the holding capacitor Ch to the second driving voltage Vss supplied to the second driving voltage line PL2 in response to the voltage of the second control node N2. The third driver 375 according to an aspect may include a third transistor cT3. The third transistor cT3 may include a gate terminal connected to the second control node N2, a first terminal connected to the holding node Nh, and a second terminal connected to the second driving voltage line PL2. The third transistor cT3 may be turned on by the voltage of the second control node N2 and may connect the holding node Nh to the second driving voltage line PL2 to discharge the voltage of the holding node Nh and the voltage of the holding capacitor Ch to the second driving voltage line PL2, thereby initializing the voltage of the holding node Nh and the voltage of the holding capacitor Ch to the second driving voltage Vss.

The fourth driver 377 may initialize the voltage of the first control node N1 to the second driving voltage Vss supplied to the second driving voltage line PL2 in response to the voltage of the second control node N2. The fourth driver 377 according to an aspect may include a fourth transistor cT4. The fourth transistor cT4 may include a gate terminal connected to the second control node N2, a first terminal connected to the first control node N1, and a second terminal connected to the second driving voltage line PL2. The fourth transistor cT4 may be turned on by the voltage of the second control node N2 and may connect the first control node N1 to the second driving voltage line PL2 to discharge the voltage of the first control node N1 to the second driving voltage line PL2, thereby initializing the voltage of the first control node N1 to the second driving voltage Vss.

Each of the transistors constituting the first holding stage HS1 according to the present aspect may be formed of a TFT including an oxide semiconductor layer such as ZnO, InZnO, or InGaZnO and may include the same oxide semiconductor layer as that of each of the TFTs constituting the first driving stage DST1.

Hereinafter, an operation of the first holding stage HS1 according to the present aspect will be described with reference to FIGS. 9 and 10.

The first holding stage HS1 according to the present aspect may be driven in a display period DP and a touch sensing period TP.

First, during the touch sensing period TP, the first holding stage HS1 may charge a voltage into the holding capacitor Ch through the holding node Nh in response to the first holding start signal Vpre1 supplied from a front fourth driving stage, hold the voltage charged into the holding capacitor Ch for a certain time, precharge the first control node N1 with the voltage charged into the holding capacitor Ch, and supply the first carry clock CCLK1 as the first carry signal CS1 to the first driving stage of the second driving stage group DSG2 through the output node Nout. During the touch sensing period TP, the first holding stage HS1 may hold the voltage of the holding node Nh for a certain time in first to third holding periods t1 to t3, may subsequently hold the voltage of the first control node N1 for a certain time in the third holding period t3, and may subsequently output the first carry clock CCLK1 as the first carry signal CS1 immediately after the touch sensing period TP ends or at a start time of the display period DP.

First, in the first holding period t1, when the first holding start signal Vpre1 having a high voltage level VH is supplied from the front fourth driving stage, the first transistor cT1 of the first driver 371 may be turned on by the first holding start signal Vpre1, and thus, the holding node Nh may be precharged with the first driving voltage Vdd supplied through the first transistor cT1 turned on by the first holding start signal Vpre1, whereby the holding capacitor Ch connected to the holding node Nh may be charged with the first driving voltage Vdd supplied to the holding node Nh and may hold a charged voltage for a relatively long time. In the first holding period t1, each of the first and second output transistors cTu and cTd of the carry output part 350 may be maintained in a turn-off state, and each of the second to fourth transistors cT2 to cT4 of the carry node controller 370 may be maintained in a turn-off state.

Subsequently, in the second holding period t2, when the first holding start signal Vpre1 supplied from the front fourth driving stage is shifted to a low voltage level, the first transistor cT1 of the first driver 371 may be turned off by the first holding start signal Vpre1 having the low voltage level. Therefore, the voltage of the holding node Nh may be held as the first driving voltage Vdd charged into the holding capacitor Ch for a relatively long time. In the second holding period t2, each of the first and second output transistors cTu and cTd of the carry output part 350 may be maintained in a turn-off state, and each of the first to fourth transistors cT1 to cT4 of the carry node controller 370 may be maintained in a turn-off state.

Subsequently, in the third holding period t3 after the second holding period t2 having a long time, when the first dummy clock DCLK1 having a first high voltage period corresponding to a high voltage level VH is supplied, the second transistor cT2 of the second driver 373 may be turned on by the first dummy clock DCLK1 having the high voltage level VH, and thus, the holding node Nh may be connected to the first control node N1 through the turned-on second transistor cT2. Therefore, the first control node N1 may be precharged with the first driving voltage Vdd charged into the holding capacitor Ch, and thus, the first output transistor cTu of the carry output part 350 may be turned on by a precharged voltage of the first control node N1 to supply a low voltage level VL of the first carry clock CCLK1, supplied through the first carry clock line, to the first driving stage of the second driving stage group DSG2 through the output node Nout, and the first driving stage of the second driving stage group DSG2 may not be enabled by the low voltage level VL of the first carry clock CCLK1. At this time, the second output transistor cTd of the carry output part 350 may maintain a turn-off state, based on the voltage of the second control node N2. In the second holding period t2, each of the first, third, and fourth transistors cT1, cT3, and cT4 of the carry node controller 370 may be maintained in a turn-off state.

Subsequently, when the first dummy clock DCLK1 maintains a second high voltage period corresponding to a high voltage level VH and the first carry clock CCLK1 having a high voltage level VH is supplied immediately after the touch sensing period TP ends or at a start time t1' of a next display period DP, the voltage of the first control node N1 connected to the holding capacitor Ch through the second transistor cT2 maintaining a turn-on state based on the first dummy clock DCLK1 may be bootstrapped according to rising of the first carry clock CCLK1 supplied to the first output transistor cTu of the carry output part 350 and may increase to a higher voltage, whereby the first output transistor cTu may be completely turned on. Therefore, the first carry clock CCLK1 having the high voltage level VH may be supplied as the first carry signal CS1 to the first driving stage of the second driving stage group DSG2 through the completely turned-on first output transistor cTu of the carry output part 350 without a voltage being lost. At this time, the second output transistor cTd of the carry output part 350 may maintain a turn-off state, based on the voltage of the second control node N2, and each of the first, third, and fourth transistors cT1, cT3, and cT4 of the carry node controller 370 may be maintained in a turn-off state.

Subsequently, when the first dummy clock DCLK1 having the low voltage level VL and the first carry clock CCLK1 having the low voltage level VL are supplied after the first carry signal CS1 is output, the second transistor cT2 of the second driver 373 may be turned off, and the voltage of the first control node N1 may decrease by a voltage variation of the first carry clock CCLK1. Therefore, the first output transistor cTu of the carry output part 350 may maintain a turn-on state and may supply the first carry clock CCLK1 having the low voltage level VL as the first carry signal CS1 to the first driving stage of the second driving stage group DSG2.

Subsequently, when the first holding reset signal Vnext1 is supplied from the first driving stage of the second driving stage group DSG2 to the second control node N2 after a start time t1' of the display period DP, the third transistor cT3 of the third driver 375 and the fourth transistor cT4 of the fourth driver 377 may be turned on based on the voltage of the second control node N2, and thus, the holding node Nh may be connected to the second driving voltage line PL2 through the turned-on third transistor cT3, and the first control node N1 may be connected to the second driving voltage line PL2 through the turned-on fourth transistor cT4. Therefore, the voltage of each of the holding node Nh, the holding capacitor Ch, and the first control node N1 may be discharged to the second driving voltage line PL2 and may be initialized to the second driving voltage Vss supplied to the second driving voltage line PL2. Simultaneously, the second output transistor cTd of the carry output part 350 may be turned on based on the voltage of the second control node N2 and may connect the output node Nout to the second driving voltage line PL2 to discharge the voltage of the output node Nout to the second driving voltage line PL2.

In the first holding stage HS1 according to the present aspect, a relatively low bias voltage is applied to the first output transistor cTu during the third holding period t3 of the touch sensing period TP, based on a voltage supplied from the holding capacitor Ch to the first control node N1, and a relatively high bias voltage is applied to the first output transistor cTu during only a relatively short bootstrapping period. Accordingly, according to the present disclosure, deterioration of the first output transistor cTu is minimized.

A configuration and an operation of each of the holding stages other than the first holding stage among the holding stages constituting each of the k holding stage groups HSG1 to HSGk are the same as the above-described first holding stage HS1, and thus, their descriptions are omitted.

Figure 11:
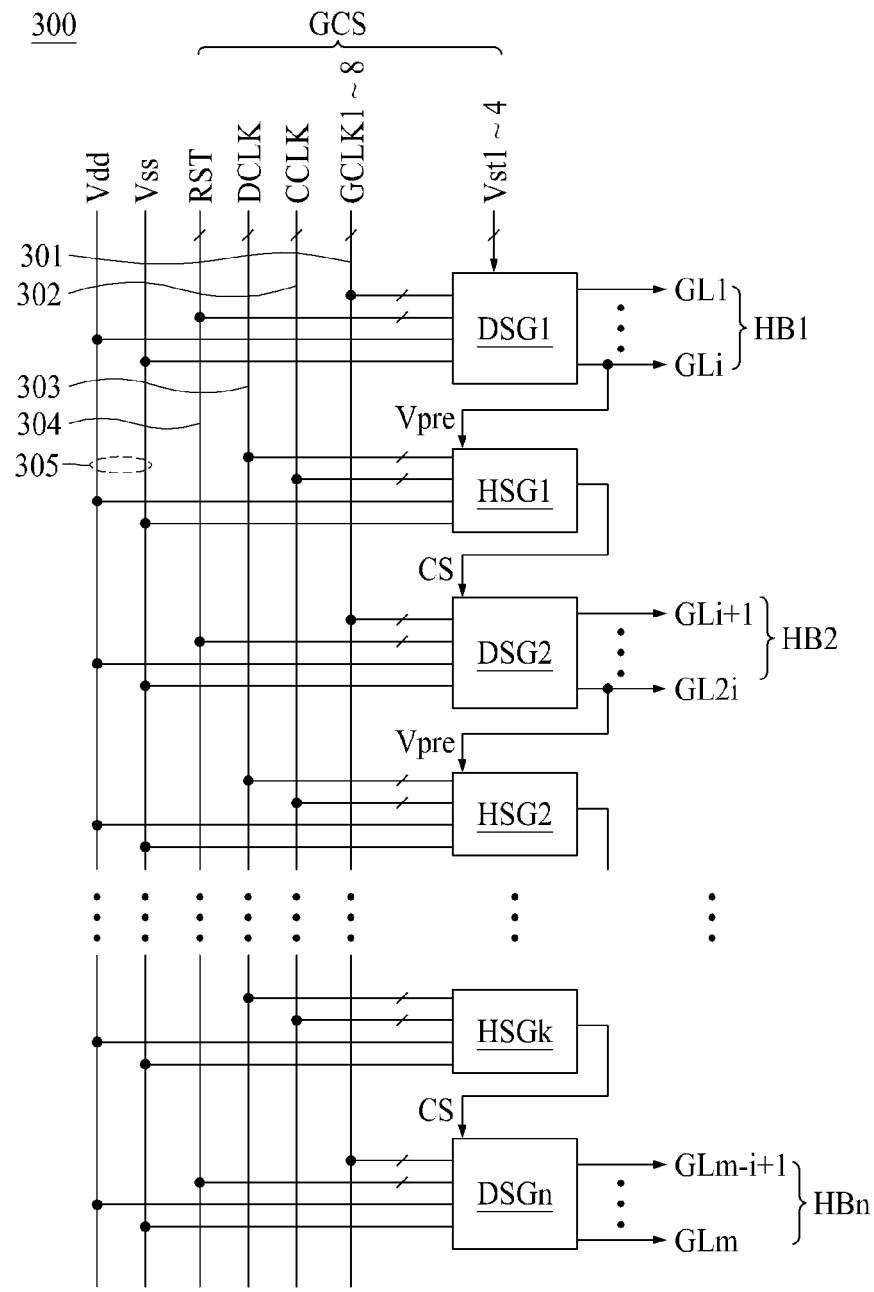
FIG. 11 is a diagram for describing a gate driving circuit according to another aspect of the present disclosure.

FIG. 11 is a diagram for describing a gate driving circuit 300 according to another aspect of the present disclosure and is configured by modifying a configuration of a holding stage group and a gate control signal.

Referring to FIG. 11, the gate driving circuit 300 according to another aspect of the present disclosure may include n number of driving stage groups DSG1 to DSGn, k number of holding stage groups HSG1 to HSGk, a shift clock line part 301, a carry clock line part 302, a dummy clock line part 303, a reset clock line part 304, and a power line part 305.

Each of the n driving stage groups DSG1 to DSGn may sequentially supply a scan pulse to i number of gate lines GL included in a corresponding horizontal block of horizontal blocks HB1 to HBn during a first period of a time division driving signal. Each of the n driving stage groups DSG1 to DSGn according to an aspect may include i number of driving stages. In this case, the gate driving circuit 300 may include a number of driving stages corresponding to the total number of gate lines.

Each of the i driving stages may include an output node connected to each of the i gate lines GL. For example, first to $i^{th}$ driving stages of a first driving stage group DSG1 may be respectively connected to first to $i^{th}$ gate lines GL1 to GLi.

The first driving stage of the i driving stages may be enabled in response to a gate start signal Vst supplied from the timing control circuit and may be reset in response to an output signal of the second driving stage. Each of the second to $i-1^{th}$ driving stages may be enabled in response to an output signal of a front driving stage and may be reset in response to an output signal of a rear driving stage. Also, the $i^{th}$ driving stage may be enabled in response to an output signal of the $i-1^{th}$ driving stage and may be reset in response to a stage reset clock supplied from the reset clock line part 304.

Except for that one gate start signal Vst and one stage reset clock RST are supplied from the timing control circuit, each of the i driving stages includes the same elements as those of the first driving stage illustrated in FIG. 8, and thus, its overlapping description is omitted.

Each of the k holding stage groups HSG1 to HSGk may be disposed between the n driving stage groups DSG1 to DSGn, and in response to an output signal supplied from a front driving stage group, each of the k holding stage groups HSG1 to HSGk may charge a voltage into a holding capacitor and may output a carry signal to a rear driving stage group, based on the voltage charged into the holding capacitor. Except for outputting one carry signal CS, each of the k holding stage groups HSG1 to HSGk is the same as the k holding stage groups illustrated in FIG. 4.

Each of the k holding stage groups HSG1 to HSGk according to an aspect may include one holding stage.

Each of the holding stages included in each of the k holding stage groups HSG1 to HSGk may receive, as the holding start signal Vpre, an output signal of a last driving stage of a front driving stage group and may be enabled according to received output signal to supply a carry clock CCLK as the carry signal CS to a first driving stage of a corresponding driving stage group of the second to $n^{th}$ driving stage groups DSG2 to DSGn. Also, each of the holding stages may be reset by a stage reset clock RST. Each of the holding stages includes the same elements as those of the first holding stage HS1 illustrated in FIGS. 9 and 10, and thus, descriptions of its configuration and operation are omitted.

The shift clock line part 301 may include first to eighth shift clock lines which are supplied with first to eighth gate shift clocks GCLK1 to GCLK8 having a sequentially shifted phase from the timing control circuit. The shift clock line part 301 is the same as the shift clock line part 301 illustrated in FIG. 4, and thus, its overlapping description is omitted.

The scan holding clock line part 302 may include one scan holding clock line which is supplied with the carry clock CCLK from the timing control circuit. The one scan holding clock line may be connected to a holding stage of each of the k holding stage groups HSG1 to HSGk. The carry clock CCLK is the same as the carry clock illustrated in FIG. 4, and thus, its overlapping description is omitted.

The dummy clock line part 303 may include one dummy clock line which is supplied with a dummy clock DCLK from the timing control circuit. The one dummy clock line may be connected to a holding stage of each of the k holding stage groups HSG1 to HSGk. The dummy clock DCLK is the same as the dummy clock illustrated in FIG. 4, and thus, its overlapping description is omitted.

The reset clock line part 304 may include one reset clock line which is supplied with the stage reset clock RST from the timing control circuit. The reset clock line may be connected to a last driving stage of each of the n driving stage groups DSG1 to DSGn and may be connected to a holding stage of each of the k holding stage groups HSG1 to HSGk. The stage reset clock RST is the same as the first reset clock illustrated in FIG. 4, and thus, its overlapping description is omitted.

The power line part 305 may include first and second driving voltage lines which are supplied with a first driving voltage Vdd and a second driving voltage Vss from the power generation circuit. The power line part 305 is the same as the power line part illustrated in FIG. 4, and thus, its overlapping description is omitted.

Except for that each of the first to $n^{th}$ driving stage groups DSG1 to DSGn is enabled by the gate start signal Vst or a carry signal output from a holding stage of each of front holding stage groups and each of the first to $k^{th}$ holding stage groups HSG1 to HSGk is enabled by an output signal of a last driving stage of each of front driving stage groups DSG2 to DSGn, the gate driving circuit 300 according to another aspect of the present disclosure is the same as the gate driving circuit illustrated in FIGS. 1 to 10, and thus, its overlapping description is omitted.

A display apparatus including the gate driving circuit 300 according to another aspect of the present disclosure may have the same effect as that of the display apparatus illustrated in FIGS. 1 to 10.

Figure 12:
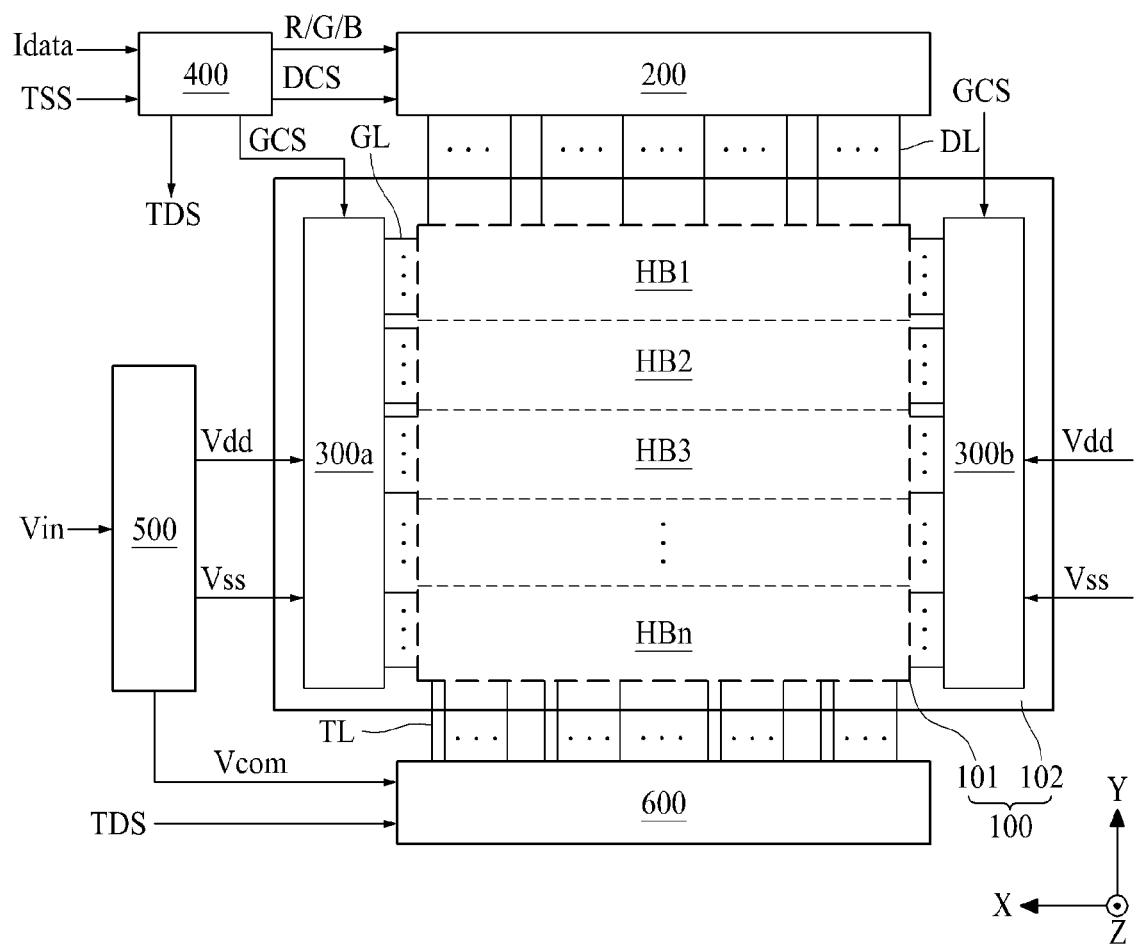
FIG. 12 is a diagram for describing a display apparatus according to another aspect of the present disclosure.
Figure 13:
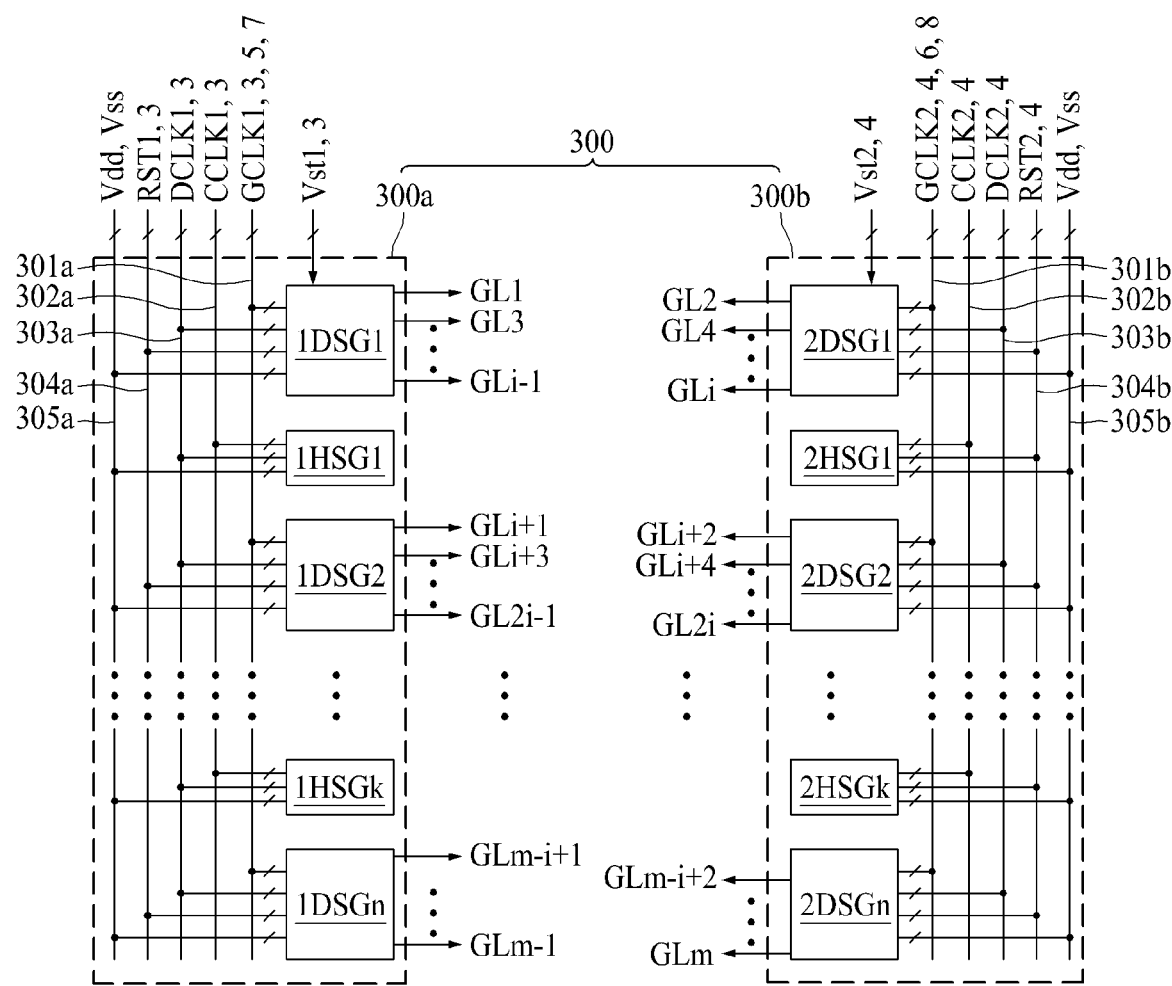
FIG. 13 is a diagram for describing a gate driving circuit illustrated in FIG. 12.

FIG. 12 is a diagram for describing a display apparatus according to another aspect of the present disclosure, and FIG. 13 is a diagram for describing a gate driving circuit illustrated in FIG. 12. The display apparatus according to another aspect of the present disclosure may be implemented by modifying the gate driving circuit of the display apparatus illustrated in FIG. 1. Hereinafter, therefore, only a gate driving circuit and elements relevant thereto will be described, and overlapping descriptions of the other elements are omitted.

Referring to FIGS. 12 and 13, a gate driving circuit 300 according to another aspect of the present disclosure may drive a plurality of gate lines GL, based on a single feeding-based interlacing manner. The gate driving circuit 300 according to an aspect may include a first shift register 300a and a second shift register 300b.

The first shift register 300a may be embedded (or integrated) into one non-display area (or a left non-display area) of the display panel 100 and may be connected to each of odd-numbered gate lines GL1, GL3, . . . , and GLm−1 of a plurality of gate lines GL1 to GLm. The first shift register 300a may sequentially supply a scan pulse to odd-numbered gate lines GL1, GL3, . . . , and GLi−1 of i gate lines GL1 to GLi included in a horizontal block group by units of horizontal blocks at every first period of a time division driving signal TDS, based on a gate control signal GCS supplied from a timing control circuit.

The first shift register 300a according to an aspect may include n number of odd driving stage groups 1DSG1 to 1DSGn, k number of odd holding stage groups 1HSG1 to 1HSGk, an odd shift clock line part 301a, an odd carry clock line part 302a, an odd dummy clock line part 303a, an odd reset clock line part 304a, and an odd power line part 305a.

Each of the n odd driving stage groups 1DSG1 to 1DSGn may sequentially supply a scan pulse to odd-numbered gate lines GL1, GL3, . . . , and GLi−1 of i gate lines GL1 to GLi included in corresponding horizontal blocks HB1 to HBn during a first period of a time division driving signal. Each of the n odd driving stage groups 1DSG1 to 1DSGn may include i/2 number of driving stages. That is, each of the n odd driving stage groups 1DSG1 to 1DSGn may include odd-numbered driving stages DST1, DST3, . . . , and DSTi−1 included in the driving stage group illustrated in FIG. 5. Therefore, the first shift register 300a may include a number of driving stages corresponding to half of the total number of gate lines.

Each of the driving stages included in each of the n odd driving stage groups 1DSG1 to 1DSGn may be configured identical to each of the odd-numbered driving stages DST1, DST3, . . . , and DSTi−1 of the driving stage group illustrated in FIG. 5. Except for that each of the driving stages is enabled by each of first and third gate start signals Vst1 and Vst3 to sequentially supply the scan pulse to odd-numbered gate lines GL1, GL3, . . . , and GLi−1, each of the driving stages includes the same elements as those of the first driving stage illustrated in FIG. 8, and thus, descriptions of its configuration and operation are omitted.

Each of the k odd holding stage groups 1HSG1 to 1HSGk may be disposed between the n odd driving stage groups 1DSG1 to 1DSGn, and during a second period of the time division driving signal, in response to an output signal supplied from each of front odd driving stage groups 1DSG1 to 1DSGn−1, each of the k odd holding stage groups 1HSG1 to 1HSGk may charge a holding voltage into a holding capacitor and may sequentially supply first and third carry signals to a rear odd driving stage group, based on the holding voltage charged into the holding capacitor, and the first and third carry signals may be respectively applied as the first and third gate start signals Vst1 and Vst3 to first and second driving stages of the rear odd driving stage group.

Each of the k odd holding stage groups 1HSG1 to 1HSGk according to an aspect may include first and second holding stages. That is, each of the k odd holding stage groups 1HSG1 to 1HSGk may be configured with the odd-numbered holding stages HS1 and HS3 of the holding stage group illustrated in FIG. 7.

Each of the first and second holding stages may be enabled by a corresponding output signal of two output signals respectively supplied from i−1$^{th}$ and i$^{th}$ driving stages of a front odd driving stage group and may supply, as the first and third carry signals, a corresponding carry clock of first and third carry clocks CCLK1 and CCLK3 to a corresponding driving stage of first and second driving stages of each of second to n$^{th}$ odd driving stage groups 1DSG2 to 1DSGn. Also, the first and second holding stages may be sequentially reset by a corresponding stage reset clock of first and third stage reset clocks RST1 and RST3.

Each of the holding stages included in each of the k odd holding stage groups 1HSG1 to 1HSGk may be configured identical to each of the odd-numbered holding stages HS1 and HS3 of the holding stage group illustrated in FIG. 7. Except for that the holding stages are enabled by two output signals respectively supplied from i−1$^{th}$ and i$^{th}$ driving stages of a front odd driving stage group to supply the first and third carry signals, each of the holding stages includes the same elements as those of the first holding stage HS1 illustrated in FIGS. 9 and 10, and thus, descriptions of its configuration and operation are omitted.

Except for that the odd shift clock line part 301a includes four shift clock lines which are supplied with odd-numbered gate shift clocks GCLK1, GCLK3, GCLK5, and GCLK7 of first to eighth gate shift clocks GCLK1 to GCLK8 having a sequentially shifted phase from the timing control circuit, the odd shift clock line part 301a is the same as the illustrations of FIGS. 4 to 6, and thus, its overlapping description is omitted.

Except for that the odd carry clock line part 302a includes two carry clock lines which are supplied with first and third carry clocks CCLK1 and CCLK3 of first to fourth carry clocks CCLK1 to CCLK4 having a sequentially shifted phase from the timing control circuit, the odd carry clock line part 302a is the same as the illustrations of FIGS. 4 to 7, and thus, its overlapping description is omitted.

Except for that the odd dummy clock line part 303a includes two dummy clock lines which are supplied with first and third dummy clocks DCLK1 and DCLK3 of first to fourth dummy clocks DCLK1 to DCLK4 having a sequentially shifted phase from the timing control circuit, the odd dummy clock line part 303a is the same as the illustrations of FIGS. 4 to 7, and thus, its overlapping description is omitted.

Except for that the odd reset clock line part 304a includes two reset clock lines which are supplied with first and third stage reset clocks RST1 and RST3 of first to fourth stage reset clocks RST1 to RST4 from the timing control circuit, the odd reset clock line part 304a is the same as the illustrations of FIGS. 4 to 7, and thus, its overlapping description is omitted.

The odd power line part 305a include first and second driving voltage lines which are supplied with a first driving voltage Vdd and a second driving voltage Vss from the power generation circuit. The odd power line part 305a is the same as the power line part illustrated in FIG. 4, and thus, its overlapping description is omitted.

The second shift register 300b may be embedded (or integrated) into the other non-display area (or a right non-display area) of the display panel 100 and may be connected to each of even-numbered gate lines GL2, GL4, . . . , and GLm of the plurality of gate lines GL1 to GLm. The second shift register 300b may sequentially supply the scan pulse to even-numbered gate lines GL2, GL4, . . . , and GLi of i gate lines GL1 to GLi included in a horizontal block group by units of horizontal blocks at every first period of a time division driving signal TDS, based on a gate control signal GCS supplied from a timing control circuit.

The second shift register 300b according to an aspect may include n number of even driving stage groups 2DSG1 to 2DSGn, k number of even holding stage groups 2HSG1 to 2HSGk, an even shift clock line part 301b, an even carry clock line part 302b, an even dummy clock line part 303b, an even reset clock line part 304b, and an even power line part 305b.

Each of the n even driving stage groups 2DSG1 to 2DSGn may sequentially supply a scan pulse to even-numbered gate lines GL2, GL4, . . . , and GLi of i gate lines GL1 to GLi included in corresponding horizontal blocks HB1 to HBn during the first period of the time division driving signal. Each of the n even driving stage groups 2DSG1 to 2DSGn may include i/2 number of driving stages. That is, each of the n even driving stage groups 2DSG1 to 2DSGn may include even-numbered driving stages DST2, DST4, . . . , and DSTi included in the driving stage group illustrated in FIG. 5. Therefore, the second shift register 300b may include a number of driving stages corresponding to half of the total number of gate lines.

Each of the driving stages included in each of the n even driving stage groups 2DSG1 to 2DSGn may be configured identical to each of the even-numbered driving stages DST2, DST4, . . . , and DSTi of the driving stage group illustrated in FIG. 5. Except for that each of the driving stages is enabled by each of second and fourth gate start signals Vst2 and Vst4 to sequentially supply the scan pulse to even-numbered gate lines GL2, GL4, . . . , and GLi, each of the driving stages includes the same elements as those of the first driving stage illustrated in FIG. 8, and thus, descriptions of its configuration and operation are omitted.

Each of the k even holding stage groups 2HSG1 to 2HSGk may be disposed between the n even driving stage groups 2DSG1 to 2DSGn, and during the second period of the time division driving signal, in response to an output signal supplied from each of front even driving stage groups 2DSG1 to 2DSGn−1, each of the k even holding stage groups 2HSG1 to 2HSGk may charge a holding voltage into a holding capacitor and may sequentially supply second and fourth carry signals to a rear even driving stage group, based on the holding voltage charged into the holding capacitor, and the second and fourth carry signals may be respectively applied as the second and fourth gate start signals Vst2 and Vst4 to first and second driving stages of the rear even driving stage group.

Each of the k even holding stage groups 2HSG1 to 2HSGk according to an aspect may include first and second holding stages. That is, each of the k even holding stage groups 2HSG1 to 2HSGk may be configured with the even-numbered holding stages HS2 and HS4 of the holding stage group illustrated in FIG. 7.

Each of the first and second holding stages may be enabled by a corresponding output signal of two output signals respectively supplied from $i-1^{th}$ and $i^{th}$ driving stages of a front even driving stage group and may supply, as the second and fourth carry signals, a corresponding carry clock of second and fourth carry clocks CCLK2 and CCLK4 to a corresponding driving stage of first and second driving stages of each of second to nth even driving stage groups 2DSG2 to 2DSGn. Also, the first and second holding stages may be sequentially reset by a corresponding stage reset clock of second and fourth stage reset clocks RST2 and RST4.

Each of the holding stages included in each of the k even holding stage groups 2HSG1 to 2HSGk may be configured identical to each of the even-numbered holding stages HS2 and HS4 of the holding stage group illustrated in FIG. 7. Except for that the holding stages are enabled by two output signals respectively supplied from $i-1^{th}$ and $i^{th}$ driving stages of a front even driving stage group to supply the second and fourth carry signals, each of the holding stages includes the same elements as those of the first holding stage HS1 illustrated in FIGS. 9 and 10, and thus, descriptions of its configuration and operation are omitted.

Except for that the even shift clock line part 301b includes four shift clock lines which are supplied with even-numbered gate shift clocks GCLK2, GCLK4, GCLK6, and GCLK8 of the first to eighth gate shift clocks GCLK1 to GCLK8 having a sequentially shifted phase from the timing control circuit, the even shift clock line part 301b is the same as the illustrations of FIGS. 4 to 6, and thus, its overlapping description is omitted.

Except for that the even carry clock line part 302b includes two carry clock lines which are supplied with second and fourth carry clocks CCLK2 and CCLK4 of the first to fourth carry clocks CCLK1 to CCLK4 having a sequentially shifted phase from the timing control circuit, the even carry clock line part 302b is the same as the illustrations of FIGS. 4 to 7, and thus, its overlapping description is omitted.

Except for that the even dummy clock line part 303b includes two dummy clock lines which are supplied with second and fourth dummy clocks DCLK2 and DCLK4 of the first to fourth dummy clocks DCLK1 to DCLK4 having a sequentially shifted phase from the timing control circuit, the even dummy clock line part 303b is the same as the illustrations of FIGS. 4 to 7, and thus, its overlapping description is omitted.

Except for that the even reset clock line part 304b includes two reset clock lines which are supplied with second and fourth stage reset clocks RST2 and RST4 of the first to fourth stage reset clocks RST1 to RST4 from the timing control circuit, the even reset clock line part 304b is the same as the illustrations of FIGS. 4 to 7, and thus, its overlapping description is omitted.

The even power line part 305b include first and second driving voltage lines which are supplied with the first driving voltage Vdd and the second driving voltage Vss from the power generation circuit. The even power line part 305b is the same as the power line part illustrated in FIG. 4, and thus, its overlapping description is omitted.

A display apparatus including the gate driving circuit 300 according to the present aspect may provide the same effect as that of the above-described display apparatus according to an aspect of the present disclosure and may secure a data charging period when high speed driving of 120 Hz or more is performed, based on left-right overlap driving of a scan pulse using the double feeding-based interlacing manner using the first shift register 300a and the second shift register 300b.

Each of the first and second shift registers 300a and 300b of the gate driving circuit 300 illustrated in FIGS. 12 and 13 may have the same configuration as that of the gate driving circuit illustrated in FIGS. 5 to 10. In this case, the first shift register 300a may supply the scan pulse to one side of each of the plurality of gate lines, and simultaneously, the second shift register 300b may supply the scan pulse to the other side of each of the plurality of gate lines. Therefore, each of the plurality of gate lines may be driven in a double feeding manner where the scan pulse is simultaneously supplied to both sides of each of the gate lines, and thus, the voltage drop of the scan pulse caused by a line resistance of each of the gate lines is minimized, thereby improving a data charging characteristic.

In addition, each of the first and second shift registers 300a and 300b of the gate driving circuit 300 illustrated in FIGS. 12 and 13 may be configured identical to the gate driving circuit illustrated in FIG. 11.

Figure 14:
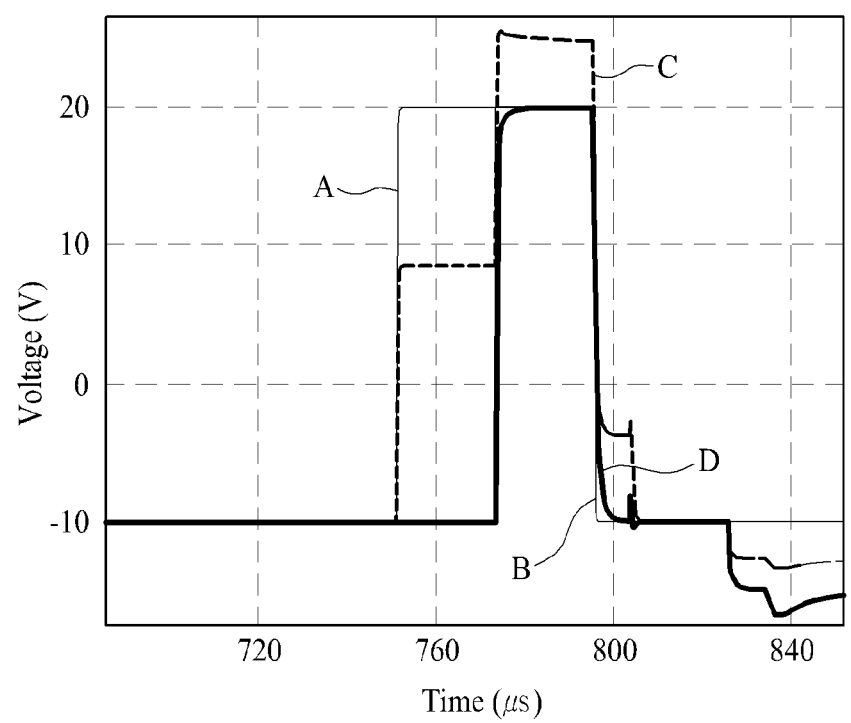
FIG. 14 is a waveform diagram showing an operation waveform of a holding stage according to an aspect of the present disclosure.

FIG. 14 is a waveform diagram showing an operation waveform of a holding stage according to an aspect of the present disclosure. In FIG. 14A, an A waveform shows a dummy clock, a B waveform shows a carry clock, a C waveform shows a voltage of a first control node, and a D waveform shows a carry signal.

As seen in FIG. 14, in the holding stage according to an aspect of the present disclosure, it may be confirmed that a carry signal D is normally output based on the voltage of the first control node. Particularly, the first control node is precharged during only a short period (for example, three horizontal periods) where a dummy clock A is applied, and thus, it may be confirmed that deterioration of a first output transistor cTu caused by the voltage of the first control node is minimized.

In the display apparatus according to an aspect of the present disclosure, in a plurality of touch sensing periods in one frame, a voltage precharged into each of a plurality of holding stages may be charged into a holding capacitor and may be held by the holding capacitor for a long time, and thus, deterioration of a first output transistor of a carry output part is reduced, thereby preventing the reliability of a carry signal from being reduced because a voltage of the carry signal output through the first output transistor is insufficient. Also, in the display apparatus according to an aspect of the present disclosure, each holding stage may be configured with six transistors, and thus, a circuit area of each holding stage is reduced, thereby decreasing a width of a gate driving circuit.

As described above, the display apparatus according to the aspects of the present disclosure minimizes deterioration of an output transistor which outputs a carry clock as a carry signal, based on a precharging voltage supplied to a plurality of holding stages driven at every touch sensing periods in one frame, and thus, prevents the reliability of the carry signal from being reduced when a voltage of the carry signal output through the output transistor is insufficient.

Moreover, in the display apparatus according to the aspects of the present disclosure, a configuration of each of a plurality of holding stages driven at every touch sensing periods in one frame is simplified, and thus, a circuit area of each of the holding stages is reduced. Accordingly, a width of a gate driving circuit is reduced, and thus, a bezel width is reduced.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a display panel having a display area including a plurality of gate lines, a plurality of data lines, and a plurality of touch sensors;
   a gate driving circuit dividing the display area into a plurality of horizontal blocks and driving gate lines of a horizontal block by a horizontal block unit during every display period in one frame; and
   a touch driving circuit sensing a touch through touch sensors of the horizontal block by the horizontal block unit during every touch sensing period in the one frame,
   wherein the gate driving circuit includes:
   a plurality of driving stage groups, each driving stage group including a plurality of driving stages supplying a scan pulse to gate lines included in a corresponding horizontal block during every display period; and
   a plurality of holding stage groups, each holding stage group including at least one holding stage outputting a carry signal to a rear driving stage group, the plurality of holding stage groups disposed between the plurality of driving stage groups, and
   the at least one holding stage charges a holding voltage into a holding capacitor in response to an output signal supplied from a front driving stage group and outputs the carry signal to the rear driving stage group, based on the holding voltage charged into the holding capacitor.

2. The display apparatus of claim 1, wherein
   in response to the output signal supplied from the front driving stage group, the at least one holding stage charges a first driving voltage into the holding capacitor through a holding node,
   in response to a dummy clock, the at least one holding stage charges a first control node with a voltage stored in the holding capacitor, and
   in response to a charged voltage of the first control node, the at least one holding stage outputs a carry clock as the carry signal through an output node.

3. The display apparatus of claim 2, wherein the at least one holding stage charges a second control node with an output signal supplied from the rear driving stage group and supplies a second driving voltage to each of the holding node, the first control node, the holding capacitor, and the output node, based on a voltage of the second control node.

4. The display apparatus of claim 1, wherein the at least one holding stage includes:
   a carry node controller controlling a voltage of a first control node and a voltage of a second control node, based on the output signal supplied from the front driving stage group, an output signal supplied from the rear driving stage group, and a dummy clock; and
   a carry output part outputting a carry clock as the carry signal through an output node or discharging a voltage of the output node, in response to the voltage of the first control node and the voltage of the second control node.

5. The display apparatus of claim 4, wherein the output signal supplied from the rear driving stage group is supplied to the second control node,
   wherein the carry node controller includes:
   a first driver supplying a first driving voltage, supplied through a first driving voltage line, to a holding node in response to the output signal supplied from the front driving stage group, the holding capacitor connected between the holding node and a second driving voltage line;
   a second driver supplying a voltage, charged into the holding capacitor, to the first control node in response to the dummy clock;
   a third driver initializing a voltage of the holding node and a voltage of the holding capacitor to a second driving voltage supplied to the second driving voltage line in response to the voltage of the second control node; and
   a fourth driver initializing the voltage of the first control node to the second driving voltage in response to the voltage of the second control node.

6. The display apparatus of claim 5, wherein the first driver includes a first transistor including a gate terminal receiving the output signal supplied from the front driving stage group, a first terminal connected to the first driving voltage line, and a second terminal connected to the holding node.

7. The display apparatus of claim 6, wherein the second driver includes a second transistor having a gate terminal receiving the dummy clock, a first terminal connected to the holding node, and a second terminal connected to the first control node.

8. The display apparatus of claim 6, wherein the third driver includes a third transistor having a gate terminal connected to the second control node, a first terminal connected to the holding node, and a second terminal connected to the second driving voltage line.

9. The display apparatus of claim 6, wherein the fourth driver includes a fourth transistor having a gate terminal connected to the second control node, a first terminal connected to the first control node, and a second terminal connected to the second driving voltage line.

10. The display apparatus of claim 5, wherein the carry output part includes:
a first output transistor having a gate terminal connected to the first control node, a first terminal receiving the carry clock, and a second terminal connected to the output node; and
a second output transistor having a gate terminal connected to the second control node, a first terminal connected to the second driving voltage line, and a second terminal connected to the output node.

11. The display apparatus of claim 5, wherein the gate driving circuit includes:
a first shift register having the plurality of driving stage groups each including the plurality of driving stages and the plurality of holding stage groups each including the at least one holding stage, and supplying the scan pulse to odd-numbered gate lines of the plurality of gate lines; and
a second shift register having the plurality of driving stage groups each including the plurality of driving stages and the plurality of holding stage groups each including the at least one holding stage, and supplying the scan pulse to even-numbered gate lines of the plurality of gate lines.

12. The display apparatus of claim 4, wherein the dummy clock includes a first high voltage period for charging the holding node and a second high voltage period for charging the first control node, and the carry clock includes a high voltage period overlapping the second period of the dummy clock.

13. The display apparatus of claim 1, wherein the touch driving circuit supplies a common voltage to touch sensors included in a corresponding horizontal block during every display period and senses a touch, performed by a touch object, through the touch sensors included in the corresponding horizontal block during every touch sensing period.

14. The display apparatus of claim 1, wherein
the touch driving circuit supplies a common voltage to touch sensors included in a corresponding horizontal block during every display period,
the touch driving circuit supplies a touch pen synchronization signal to touch sensors included in a corresponding horizontal block during every pen sensing period which is set in a first period of a plurality of touch sensing periods, and senses a signal transferred from a touch pen through each of corresponding touch sensors, and the touch driving circuit supplies a touch driving pulse to touch sensors included in a corresponding horizontal block during every finger sensing period which is set in a second period of the plurality of touch sensing periods, and senses a capacitance variation of each of corresponding touch sensors.

15. A display apparatus including a display panel having a display area where a plurality of gate lines, a plurality of data lines, and a plurality of touch sensors are disposed, comprising;
a gate driving circuit including a driving stage group that has a plurality of driving stages supplying a scan pulse to gate lines a corresponding horizontal block during every display period and a holding stage group that has at least one holding stage outputting a carry signal to a rear driving stage group,
wherein the gate driving circuit divides the display area into a plurality of horizontal blocks and drives gate lines of a horizontal block by a horizontal block unit during every display period in one frame, and
wherein the plurality of holding stage groups is disposed between adjacent driving stage groups, and the at least one holding stage charges a holding voltage into a holding capacitor in response to an output signal supplied from a front driving stage group and outputs the carry signal to the rear driving stage group in accordance with the holding voltage charged into the holding capacitor.

16. The display apparatus of claim 15, further comprising a touch driving circuit sensing a touch through touch sensors of the horizontal block by the horizontal block unit during every touch sensing period in the one frame.

17. The display apparatus of claim 15, wherein the at least one holding stage charges a first driving voltage into the holding capacitor through a holding node in response to the output signal supplied from the front driving stage group,
the at least one holding stage charges a first control node with a voltage stored in the holding capacitor in response to a dummy clock, and
the at least one holding stage outputs a carry clock as the carry signal through an output node in response to a charged voltage of the first control node.

18. The display apparatus of claim 17, wherein the at least one holding stage charges a second control node with an output signal supplied from the rear driving stage group and supplies a second driving voltage to each of the holding node, the first control node, the holding capacitor, and the output node, based on a voltage of the second control node.

19. The display apparatus of claim 15, wherein the at least one holding stage includes:
a carry node controller controlling a voltage of a first control node and a voltage of a second control node, based on the output signal supplied from the front driving stage group, an output signal supplied from the rear driving stage group, and a dummy clock; and
a carry output part outputting a carry clock as the carry signal through an output node or discharging a voltage of the output node in response to the voltage of the first control node and the voltage of the second control node.

* * * * *